(12) United States Patent
Huff

(10) Patent No.: US 8,790,534 B2
(45) Date of Patent: Jul. 29, 2014

(54) SYSTEM AND METHOD FOR PRECISION FABRICATION OF MICRO- AND NANO-DEVICES AND STRUCTURES

(75) Inventor: Michael A. Huff, Reston, VA (US)

(73) Assignee: Corporation for National Research Initiatives, Reston, VA (US)

( * ) Notice: Subject to any disclaimer, the term of this patent is extended or adjusted under 35 U.S.C. 154(b) by 373 days.

(21) Appl. No.: 13/098,867

(22) Filed: May 2, 2011

(65) Prior Publication Data

US 2011/0309553 A1  Dec. 22, 2011

Related U.S. Application Data

(60) Provisional application No. 61/329,926, filed on Apr. 30, 2010.

(51) Int. Cl.
 *B23K 28/02* (2014.01)
(52) U.S. Cl.
 CPC ......... *B23K 28/02* (2013.01); *B81C 2201/0143* (2013.01); *B81C 2900/00* (2013.01); *Y10S 977/84* (2013.01); *Y10S 977/888* (2013.01); *Y10S 977/889* (2013.01); *Y10S 977/901* (2013.01)
 USPC ............... 216/94; 156/345.39; 156/345.51; 264/400; 264/405; 425/174.4; 430/8; 250/492.1; 250/492.3; 219/121.76; 219/121.62; 977/840; 977/888; 977/889; 977/901

(58) Field of Classification Search
 CPC ... H01J 37/3056; G03F 7/2053; B23K 26/00; B23K 26/02; B23K 26/36; B23K 28/00; B81C 2201/0143; B81C 2900/00
 USPC ..................... 250/396 R, 492.2, 492.1, 492.3, 250/306–311; 204/192.32, 192.34, 298.01, 204/298.31, 298.36; 438/707, 710; 219/121.67–121.72, 121.76, 121.6, 219/121.85, 121.62; 216/94; 156/345.39, 156/345.51; 264/400, 405; 425/174.4; 430/8; 977/840, 888, 889, 901
 See application file for complete search history.

(56) References Cited

U.S. PATENT DOCUMENTS 4,891,526 A * 1/1990 Reeds ...................... 250/442.11
5,055,696 A * 10/1991 Haraichi et al. ........... 250/492.2

(Continued)

FOREIGN PATENT DOCUMENTS

| JP | 59066124 A  | * | 4/1984 |
| JP | 63165092 A1 | * | 7/1988 |
| JP | 03114684 A  | * | 5/1991 |

*Primary Examiner* — Samuel M Heinrich
(74) *Attorney, Agent, or Firm* — Nixon & Vanderhye PC

(57) ABSTRACT

A system and method are disclosed for the precision fabrication of Micro-Electro-Mechanical Systems (MEMS), Nano-Electro-Mechanical Systems (NEMS), Microsytems, Nanosystems, Photonics, 3-D integration, heterogeneous integration, and Nanotechology devices and structures. The disclosed system and method can also be used in any fabrication technology to increase the precision and accuracy of the devices and structures being made compared to conventional means of implementation. A platform holds and moves a substrate to be machined during machining and a plurality of lasers and/or ion beams are provided that are capable of achieving predetermined levels of machining resolution and precision and machining rates for a predetermined application. The plurality of lasers and/or ion beams comprises a plurality of the same type of laser and/or ion beam. Alternatively, a close-loop control system can be used with one laser or ion beam that is controlled and operated by the close-loop control system so as to achieve the predetermined levels of machining resolution and precision and machining rates for the predetermined application.

59 Claims, 14 Drawing Sheets

Diagram of Precision Fabrication System.

(56) References Cited

U.S. PATENT DOCUMENTS

| | | | |
|---|---|---|---|
| 5,504,340 A * | 4/1996 | Mizumura et al. | 250/492.21 |
| 6,783,643 B2 * | 8/2004 | Golovchenko et al. | 204/192.3 |
| 7,670,455 B2 * | 3/2010 | Keller et al. | 156/345.48 |
| 8,076,650 B2 * | 12/2011 | Smith et al. | 250/423 R |
| 2006/0285071 A1 * | 12/2006 | Erickson et al. | 351/160 R |

* cited by examiner

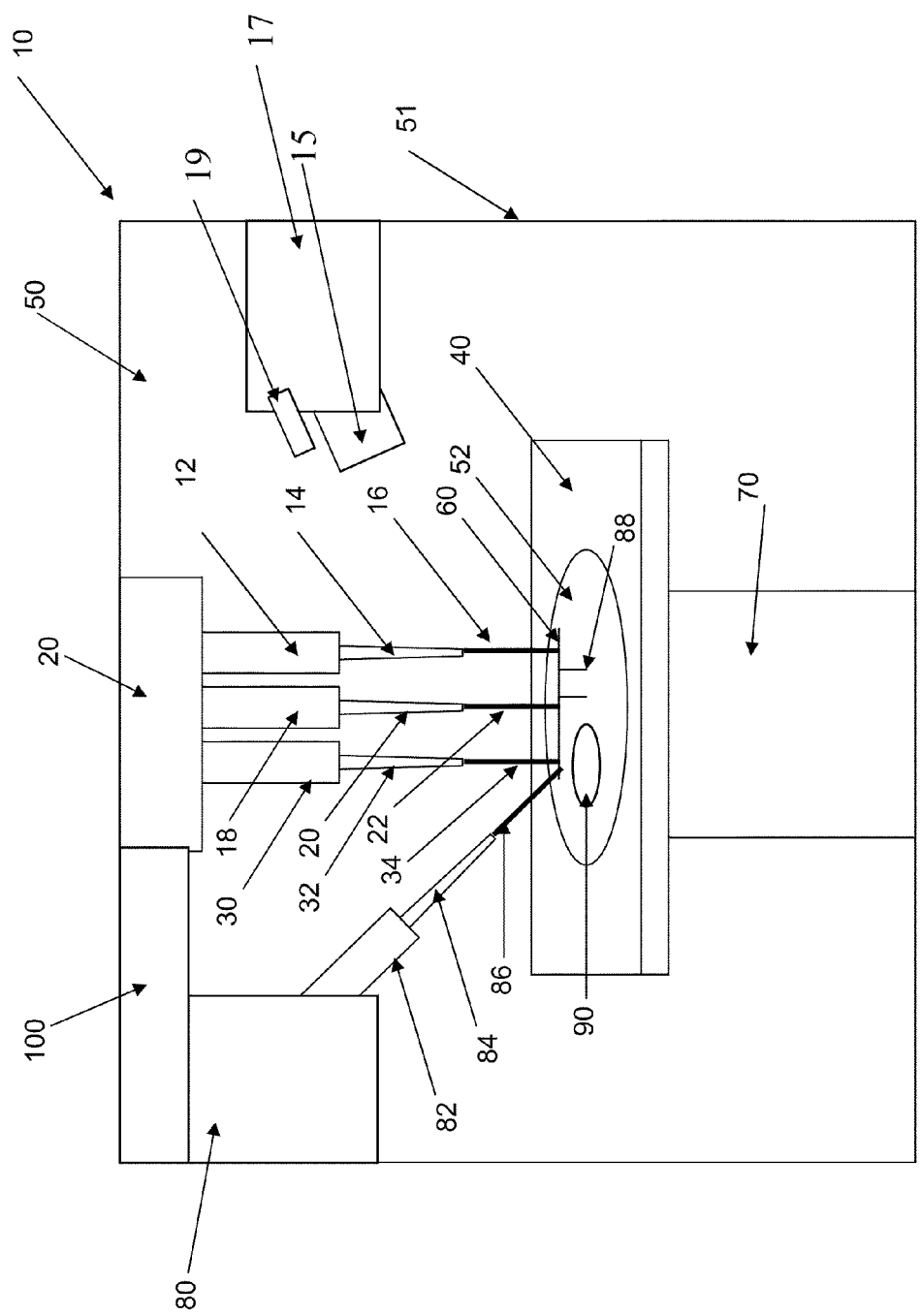
Figure 1: Diagram of Precision Fabrication System.

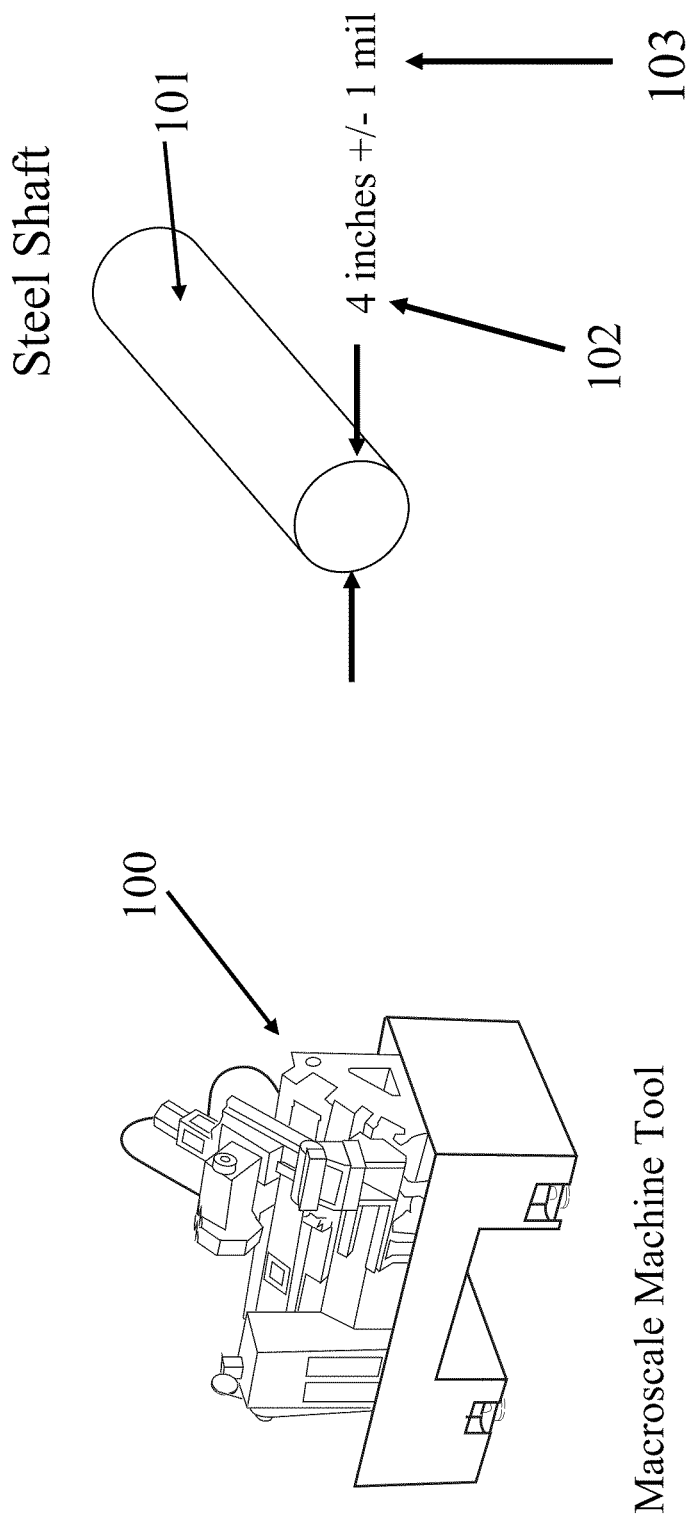
Figure 2: Example of Macroscale Machining of a Cylindrical Steel Shaft.

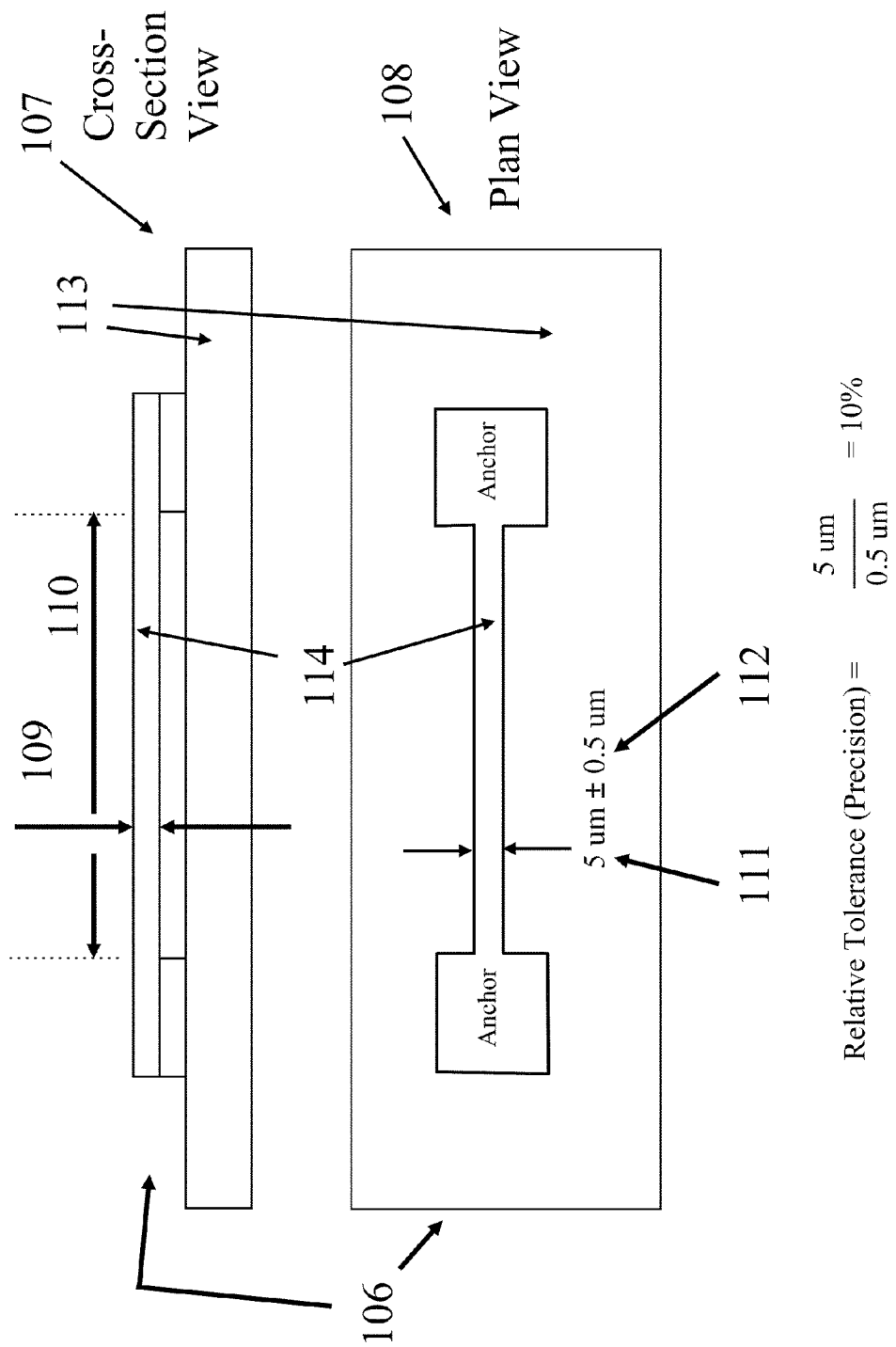
Figure 3: Example of Micromachined MEMS Resonator Beam.

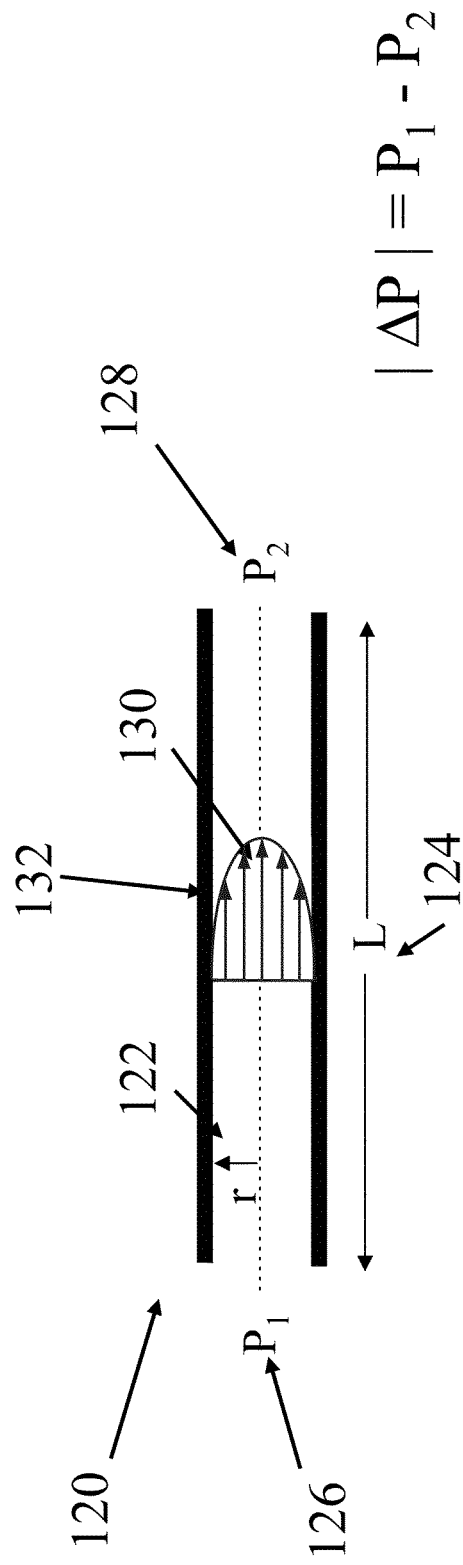
Figure 4: Fluid Flow in Microchannel.

Total effect of precision related to device's physics:
- (Digital). Least sensitive to variation - CMOS
- $1^{st}$ power (Linear). Less sensitive to variation - Rarely seen.
- $2^{nd}$ power ⎫ Resonators
- $3^{rd}$ power ⎬ Accelerometers
- $4^{th}$ power ⎭ Gyroscopes
  Etc.
  Microfluidics
  Pressure Transducers Most Micro- and Nano-Devices Involve Higher Power Physics Impact of precision is on performance and yield

138

Figure 5: Lack of Precision Often Has a Higher Power Effect on Device Physics.

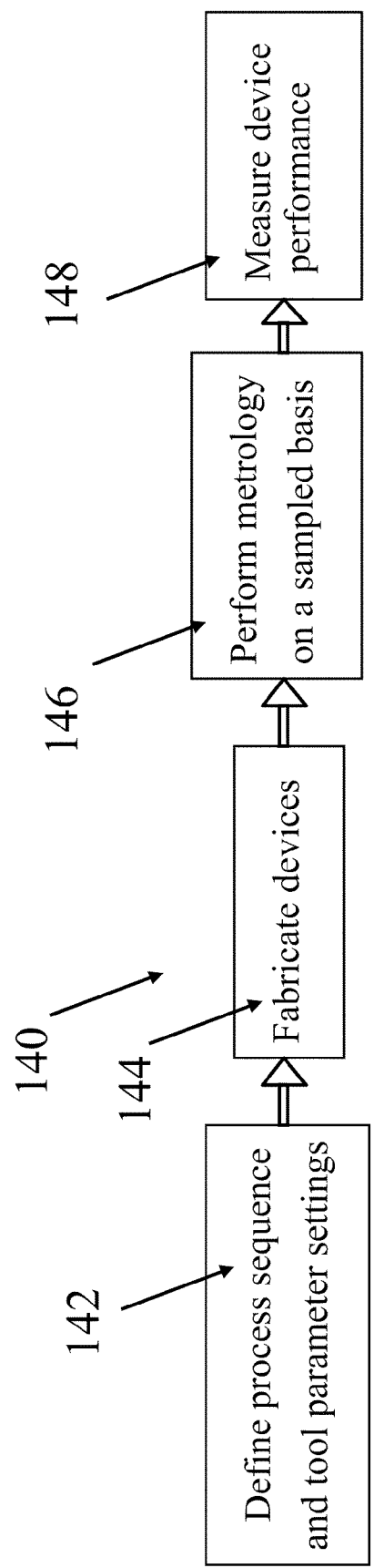
Figure 6: Open-loop manufacturing process typically employed in micro- and nano-device fabrication.

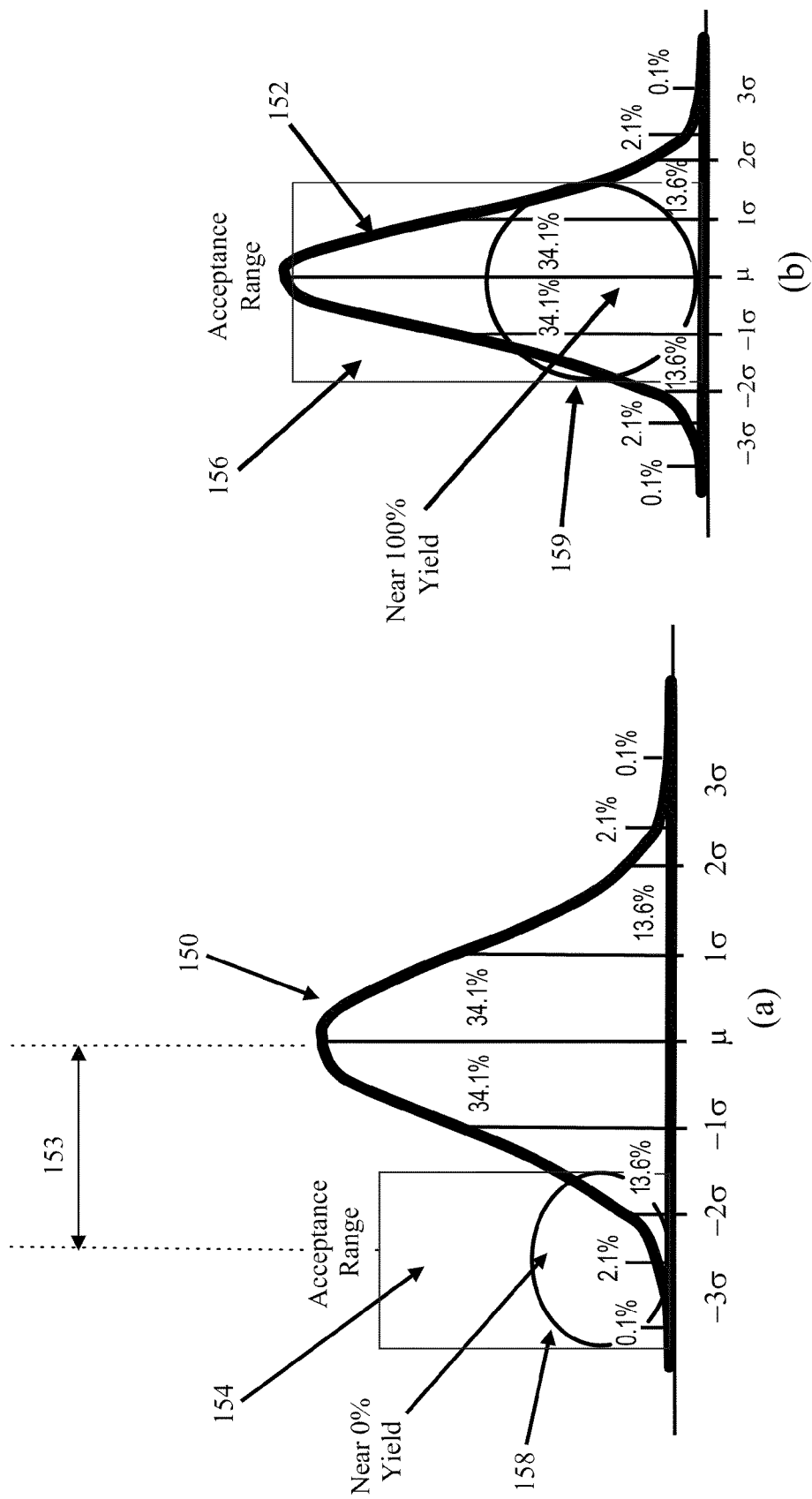
Figure 7: Statistical variations and bias errors of manufacturing processes and their effect on yields.

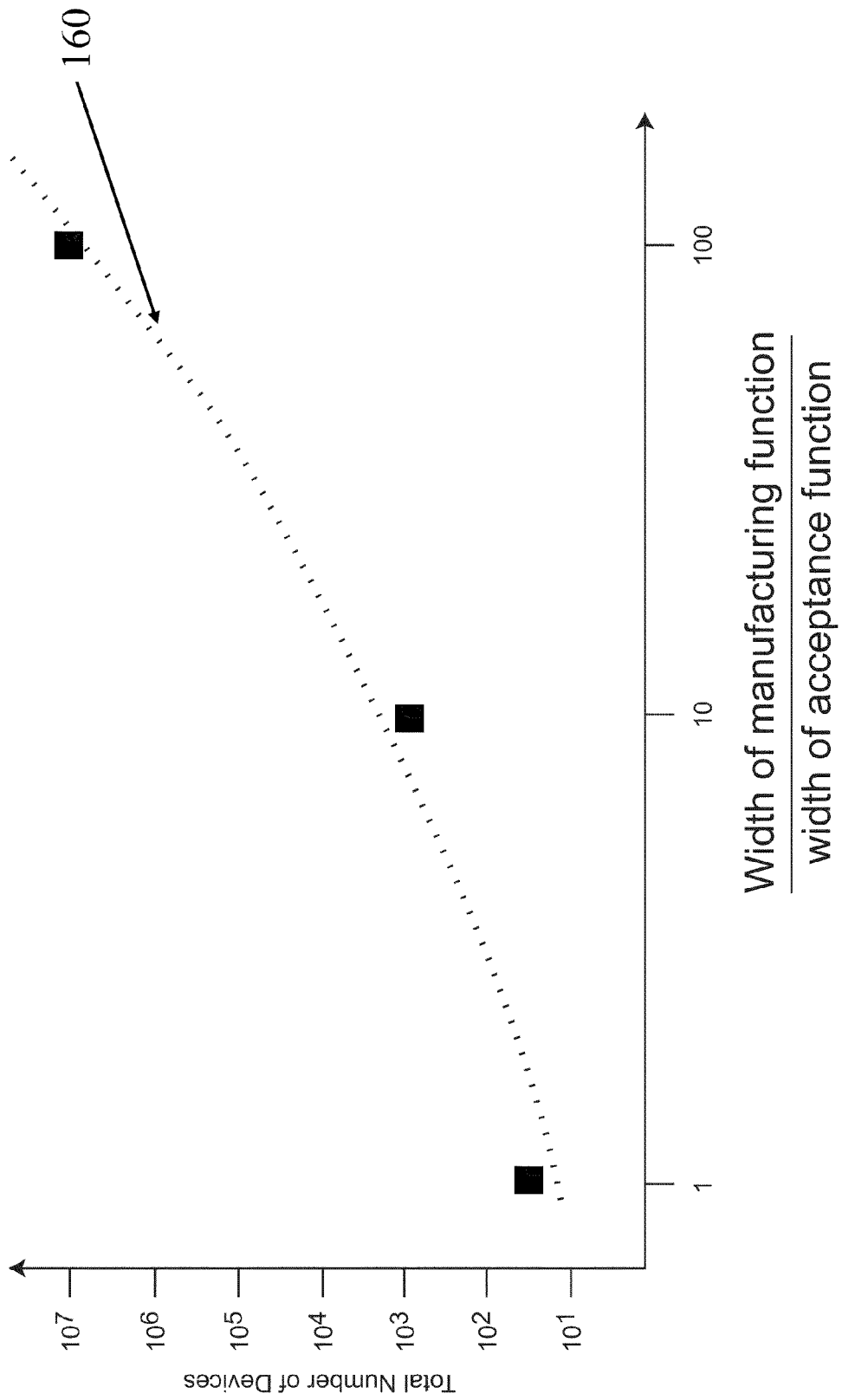
Figure 8: Plot showing the effect of lack of fabrication precision on yield.

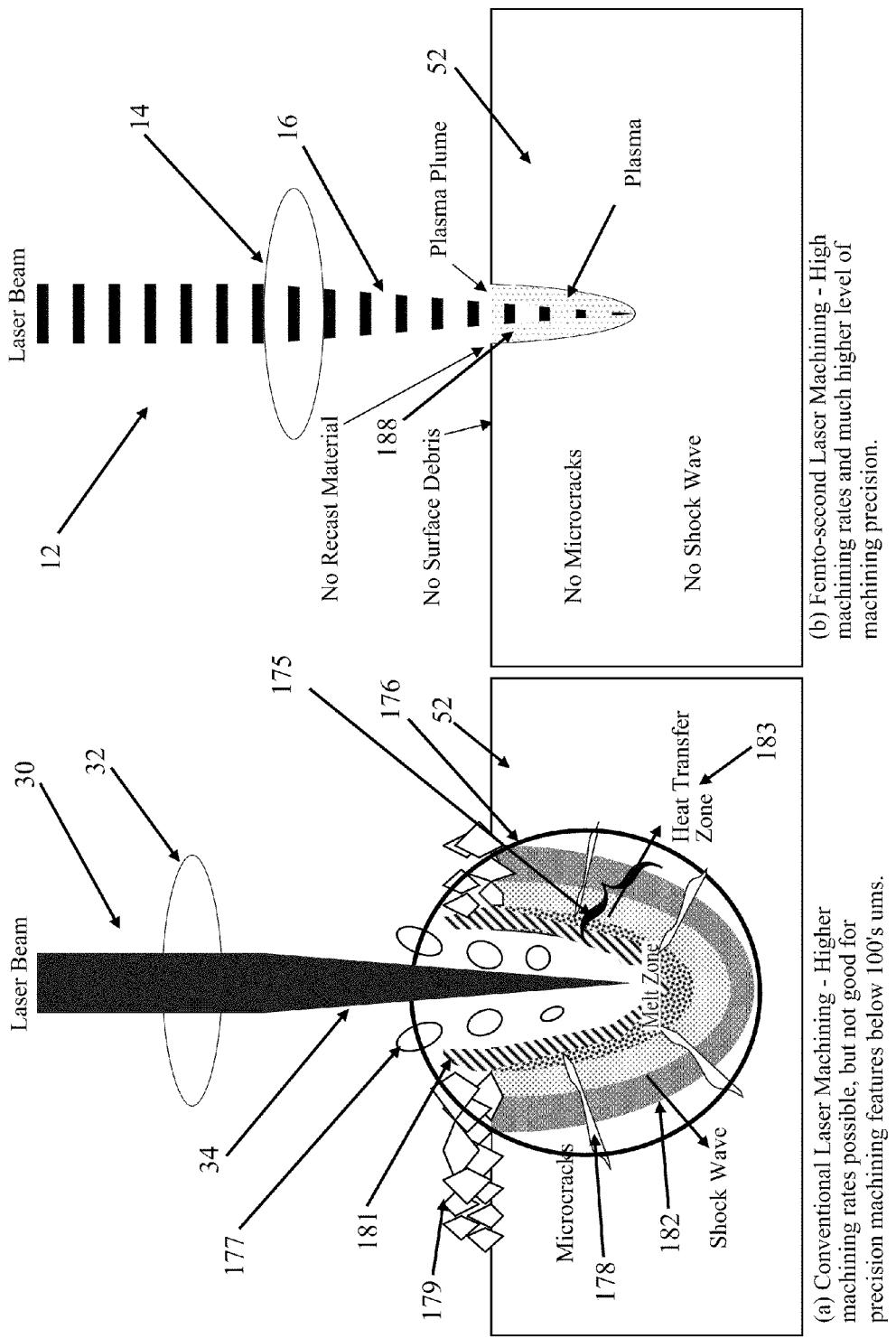
Figure 9: Comparison of conventional (a) and femto-second (b) laser machining.

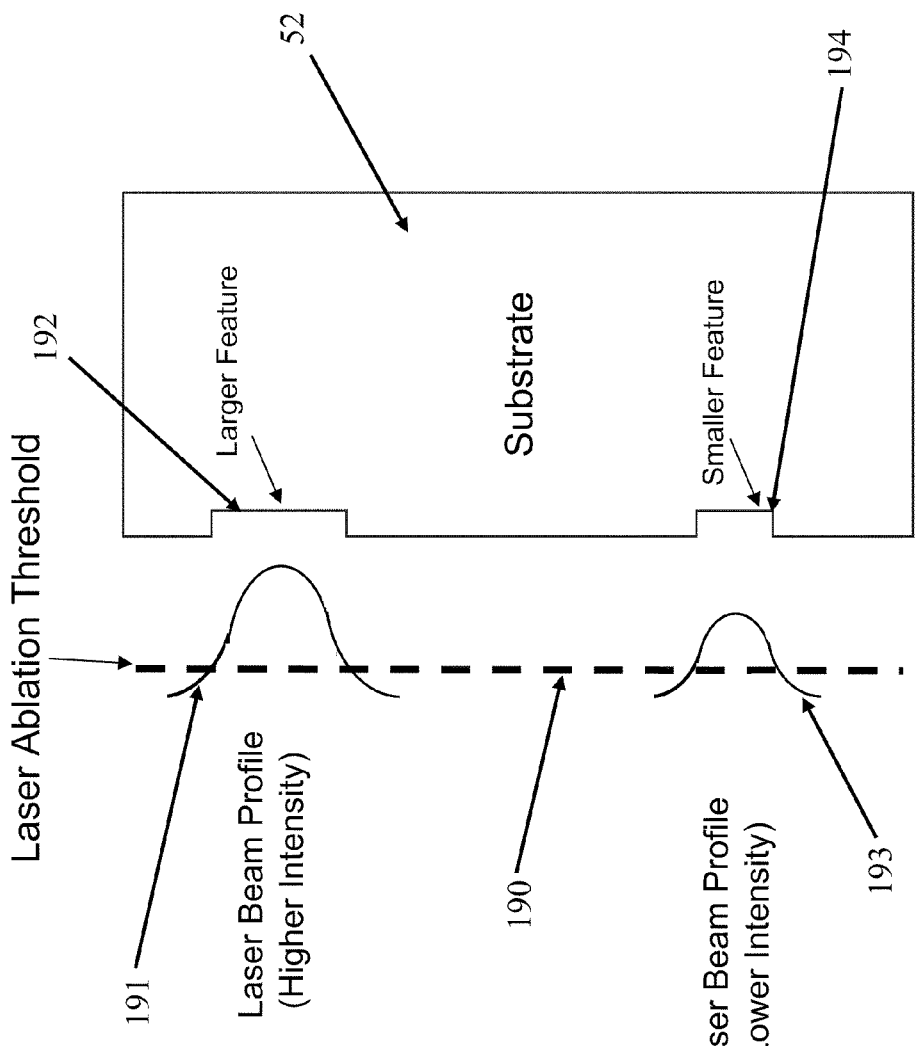
Figure 10: Illustration of how sub-micron features can be machined into a substrate by adjustment of the laser ablation threshold.

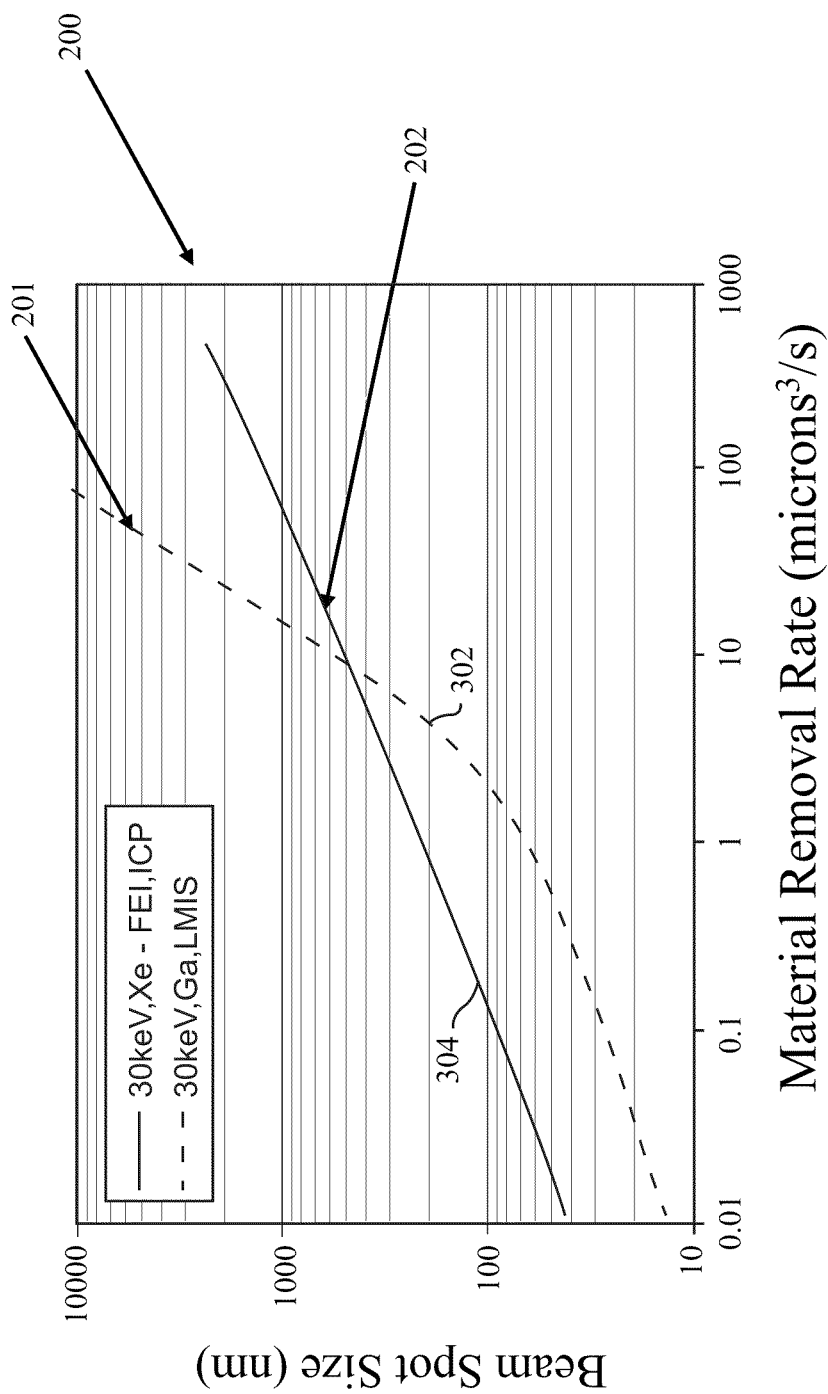
Figure 11: Removal rate as a function of beam spot size for both Plasma FIB (labeled as FEI, ICP) and conventional FIB (labeled as Ga, LMIS) for silicon material.

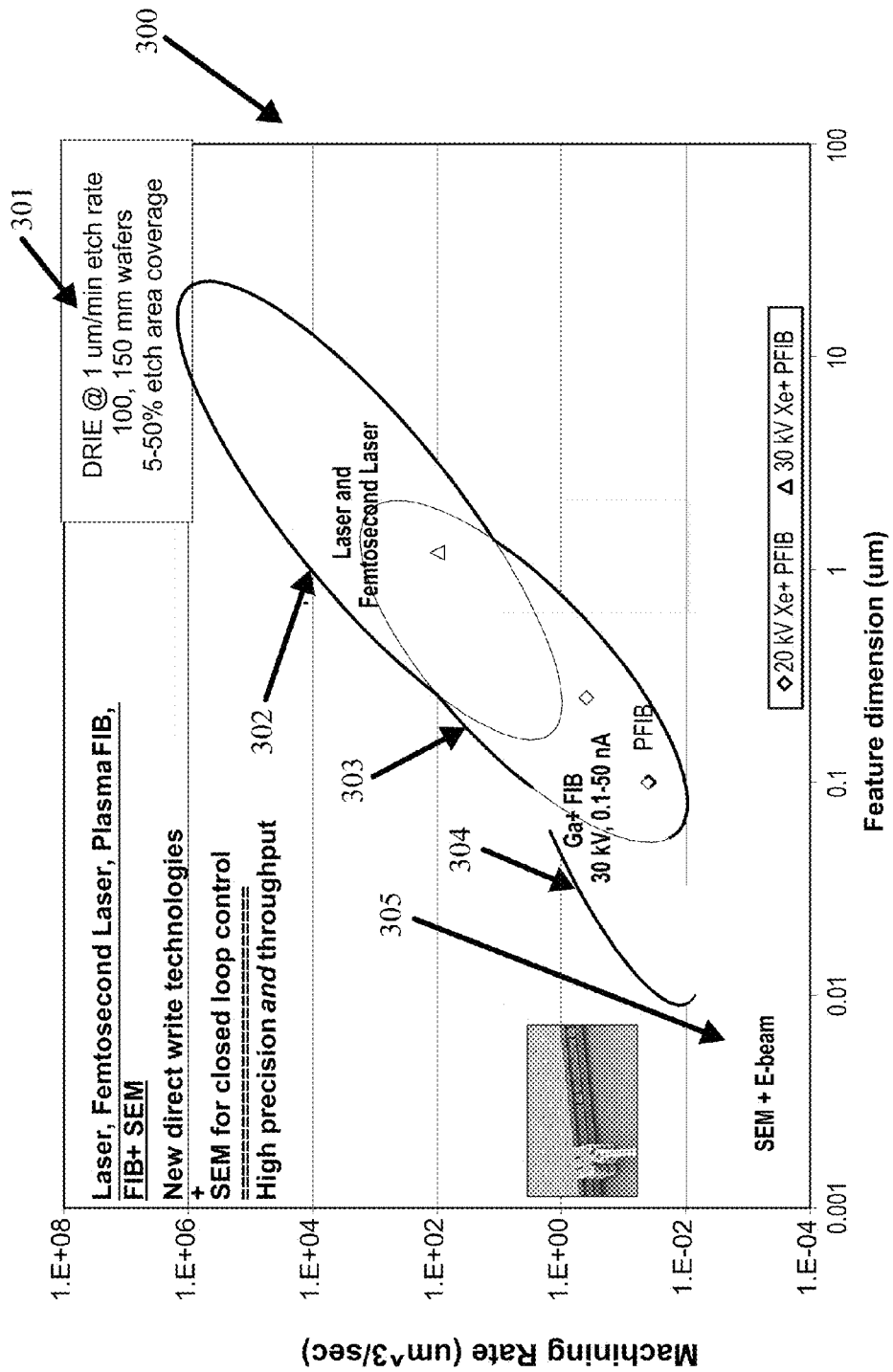
Figure 12: Plot of the machining rate versus the feature dimension of the machining process for each of the machining capabilities of the present invention. DRIE is shown on this plot in the top right corner as a comparison.

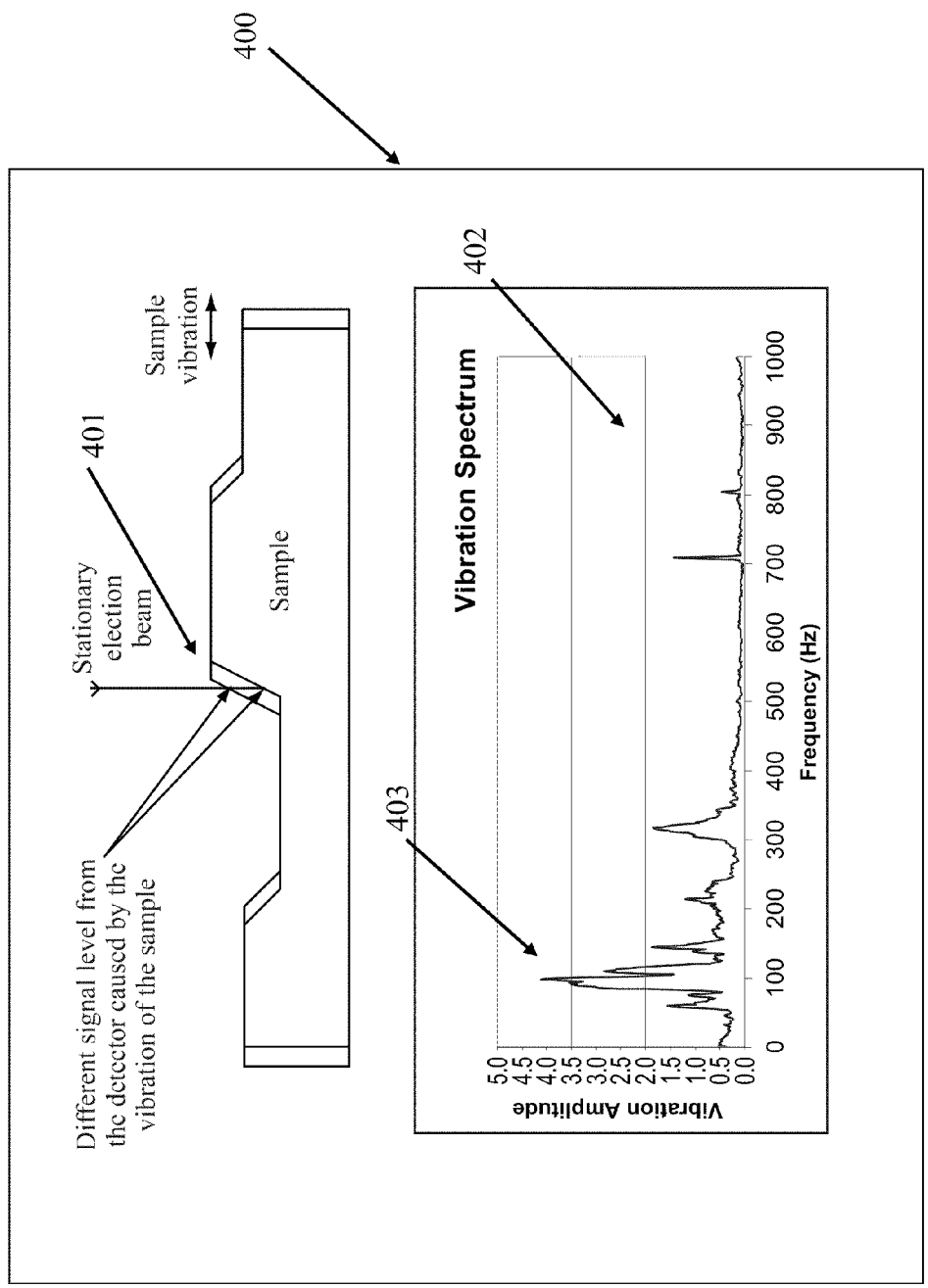
Figure 13: The measurement of mechanical resonance using SEM imaging.

Illustration of manufacturing processes being improved using feedback loops.

SYSTEM AND METHOD FOR PRECISION FABRICATION OF MICRO- AND NANO-DEVICES AND STRUCTURES

CROSS-REFERENCES TO RELATED APPLICATIONS

This application claims the benefit of Provisional Application No. 61/329,926, filed Apr. 30, 2010, the entire contents of which are hereby incorporated by reference in this application.

FIELD OF INVENTION

The present invention relates to a system and method for precision fabrication of micro- and nano-devices and structures including; Micro-Electro-Mechanical Systems (MEMS); Nano-Electro-Mechanical Systems (NEMS); Microsytems; Nanosystems; Photonics; 3-D integration; heterogeneous integration; and Nanotechnology devices and structures. The present invention can also be used in any fabrication technology to increase the precision and accuracy of the devices and structures being made compared to conventional means of implementation.

BACKGROUND OF THE INVENTION

Advances in MEMS, NEMS, Microsystems, Nanosystems, Photonics, 3-D integration, heterogeneous integration, and Nanotechnology devices and structures promise to revolutionize defense and industrial products by bringing together the computational capability of micro- and nanoelectronics with the perception and control capabilities of micro- and nano-sensors and micro- and nano-actuators, thereby enabling smart systems-on-a-chip to be mass-produced. The use of smart systems that can actively and autonomously sense and control their environments has far reaching implications for a tremendous number of future commercial and industrial applications, and promises significant benefits for the United States economy and its citizens.

In many of the applications using these technologies, there is a need to extract the ultimate performance levels from the components used in systems. High-performance devices demand high-precision manufacturing, which is obtained in macroscale-sized mechanical or electromechanical devices using extremely accurate and precise fabrication methods. However, similar levels of high precision fabrication are not currently possible using the techniques now commonly used in the implementation of micro- and nano-devices and structures. Although these devices and structures can be made very small, the relative tolerances of the critical dimensions of these devices are typically very large, as compared to macroscopic machining techniques (e.g., machine shops). This leads to a lack of manufacturing precision and less capability to control device accuracy, thereby resulting in lower device performance levels. In short, the consequence of the currently used methods of fabrication for these micro- and nano-devices and structures is that the performance is often reduced over what would be possible using fabrication methods having higher precision. New precision machining technologies that enable significant increases in the performance of micro- and nano-devices and structures for specific application domains, particularly high-performance applications are therefore needed.

In addition, precise fabrication at the micro- and nano-scale level will have the effect of substantially reducing the time and effort required to develop manufacturing processes for micro- and nano-devices and structures. Currently, enormous time and effort are spent developing fabrication processes that are sufficiently "reproducible" for a given application and are insensitive to dimensional variations so that acceptable manufacturing yields can be obtained. One consequence of this lack of precision in current fabrication methods is to lengthen the time to market for most all micro- and nano-devices and structures. Currently the development time for a new device or structure typically ranges between 5 and 20 years. The long development time has the impact of driving up the development costs of devices and structures, which is undesirable for all markets, but particularly so for small volume markets. Since many of the applications for these devices and structures involve very small markets, access to this important technology base by the commercial sector is thereby constrained. More precise micromachining techniques for implementation (in both development and manufacturing) will allow micro- and nano-devices and structures to be developed more quickly and brought to market faster and at lower cost and are therefore needed.

Additionally, the yield of manufacturing processes is often highly dependent on the precision of the processes used in manufacturing. Therefore, manufacturing processes with higher levels of precision will result in higher production yields and thereby lower production costs and therefore are needed.

SUMMARY OF THE INVENTION

The present invention relates to a system and method for precision fabrication of micro- and nano-devices and structures including: Micro-Electro-Mechanical Systems (MEMS); Nano-Electro-Mechanical Systems (NEMS); Microsytems; Nanosystems; Photonics; 3-D integration; heterogeneous integration; and Nanotechnology devices and structures. The present invention can also be used in any fabrication technology to increase the precision and accuracy of the devices and structures being made compared to conventional means of implementation.

The present invention enables micro- and nano-fabrication to be performed at superior precision levels compared to currently available systems and methods. The present invention details a system and method to simultaneously provide significantly higher machining precision than possible with current techniques, as well as material removal or machining rates nearly equivalent to current etching techniques such as Plasma reactive ion etching. The system combines a one of more machining capabilities such as a femto-second laser machining, conventional laser machining, Plasma Focused-Ion Beam machining, and/or Focused-Ion Beam machining with closed-loop control to enable a machining system having high precision machining capability. The ability to combine one or more of these machining capabilities, depending on the precision levels desired, into a single integrated etching or machining tool system with closed-loop feedback control on the machining process enables unprecedented micro- and nano-machining dimensional control, while also allowing acceptable wafer throughputs. The resulting technology is a direct-write etching or machining capability; no photolithography or masks are required during fabrication, further reducing fabrication cost and time. The present invention is a new paradigm of fabrication, for both rapid prototyping, as well as production, enabling very fast and inexpensive implementation of micro- and nano-devices and structures having high performance levels.

BRIEF DESCRIPTION OF THE DRAWINGS

FIG. 1 is a Diagram of Precision Fabrication System.

FIG. 2 is an example of Macroscale Machining of a Cylindrical Steel Shaft.

FIG. 3 is an example of Micromachined MEMS Resonator Beam.

FIG. 4 shows fluid flow in a microchannel.

FIG. 5 shows how a lack of precision often has a higher power effect on device physics.

FIG. 6 shows an open-loop manufacturing process typically employed in micro- and nano-device fabrication.

FIG. 7 shows statistical variations and bias errors of manufacturing processes and their effect on yields.

FIG. 8 is a plot showing the effect of lack of fabrication precision on yield.

FIG. 9 shows a comparison of conventional (a) and femtosecond (b) laser machining.

FIG. 10 is an illustration of how sub-micron features can be machined into a substrate by adjustment of the laser ablation threshold.

FIG. 11 shows removal rate as a function of beam spot size for both Plasma FIB (labeled as FEI, ICP) and conventional FIB (labeled as Ga, LMIS) for silicon material.

FIG. 12 is a plot of the machining rate versus the feature dimension of the machining process for each of the machining capabilities of the present invention. DRIE is shown on this plot in the top right corner as a comparison.

FIG. 13 shows the measurement of mechanical resonance using SEM imaging.

DETAILED DESCRIPTION OF THE INVENTION

Figure 14:
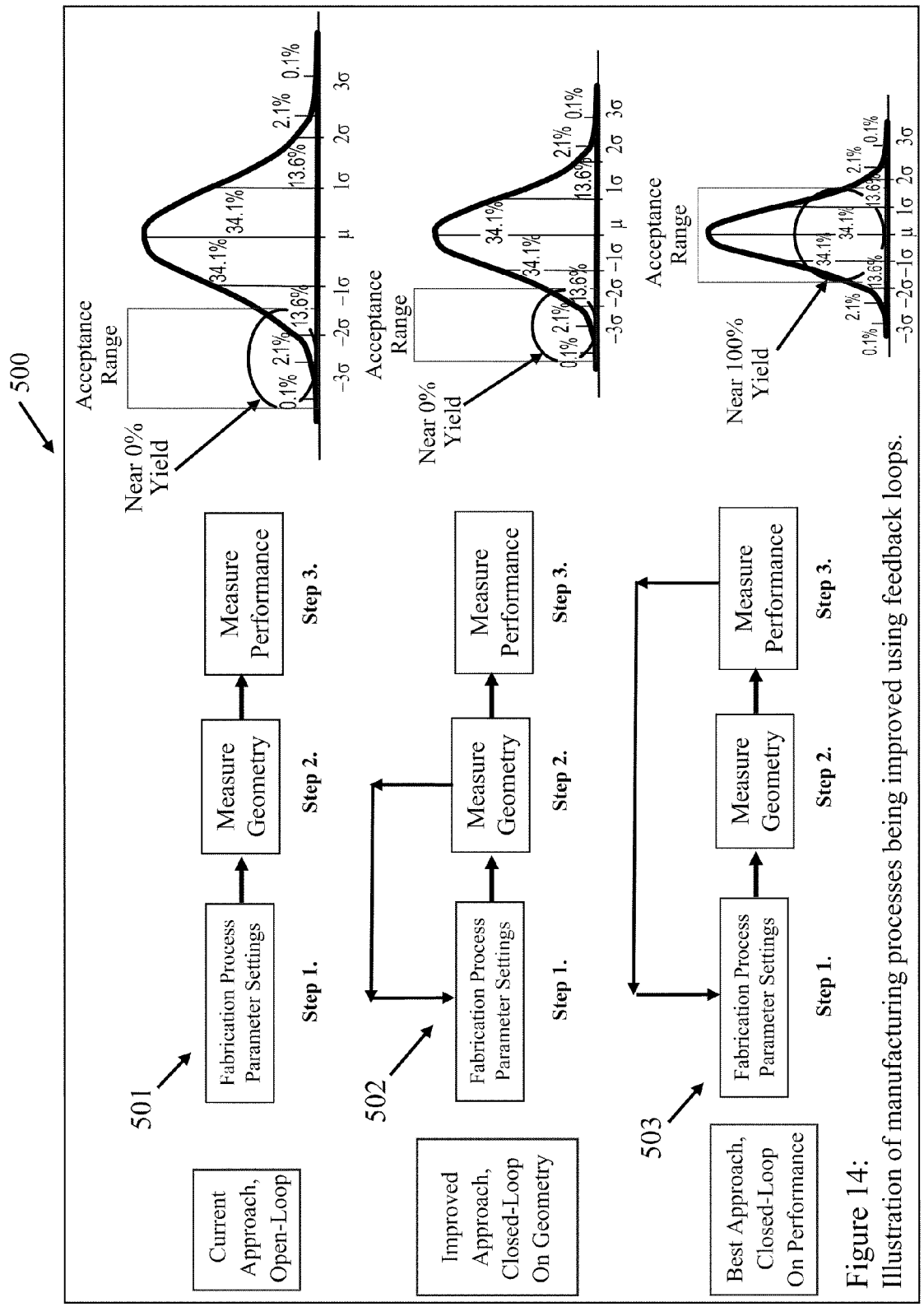
FIG. 14 is an illustration of manufacturing processes being improved using feedback loops.

The present invention relates a to system and method for precision fabrication of micro- and nano-devices and structures including: Micro-Electro-Mechanical Systems (MEMS); Nano-Electro-Mechanical Systems (NEMS); Microsytems; Nanosystems; Photonics; 3-D integration; heterogeneous integration; and Nanotechnology devices and structures. The present invention can also be used in any fabrication technology to increase the precision and accuracy of the devices and structures being made compared to conventional means of implementation.

FIG. 1 is a drawing of a fabrication system 10 showing the major system components that enable precision fabrication at the micro- and nano-scale to be implemented. The system 10 shown in FIG. 1 is needed and useful, since the performance of any mechanical or electromechanical device is strongly linked to the precision of the fabrication techniques used in its implementation. The system 10 can be used to obtain high precision in fabrication. High levels of precision will result in higher performance devices as well as lower cost.

It is often incorrectly stated that micro- and nanofabrication allows the fabrication of devices with high levels of "precision". In general, this is not the case since relative tolerances, expressed as the ratio of the variation of the dimensions of critical elements normalized to the absolute dimensions of that same elements, are much less precise than that which is routinely obtained in macroscale fabrication processes (i.e., that which is readily available in a typical macro-scale machine shop or production environments).

For example, as shown in FIG. 2, a machinist using a conventional machine tool can easily fabricate a cylindrical drive shaft 101 from a commonly used material, such as steel, with a fairly precise tolerance using standard machining tools and processes, such as a lathe 100. As an example of the typical relative tolerances that can be obtained with this typical macro-scale machining process, we assume that the shaft design required that the shaft have a nominal diameter 102 of 4.0 inches (101.600 mm). An experienced machinist working at the macroscale would easily be able to make this shaft 101 with a tolerance 103 of within ±1 mil (±25.4 microns) or better. This translates into a relative tolerance of 0.0254%, shown below and in FIG. 2.

Relative tolerance of diameter of the steel shaft 101 in FIG. 2=[(25.4×10$^{-6}$ m)/(100×10$^{-3}$ m)]×100%=0.0254%

The relative tolerances involved in the fabrication of a MEMS device can be compared by examining the expected tolerances of a critical element of the device made by surface micromachining methods as shown in FIG. 3. A surface micromachined fixed-fixed beam device 106 is shown in both cross-section and plan views 107 and 108. The free-standing portion of the beam 114, has length 110, thickness 109, and width 111. The beam is located on anchors 107 attached to the substrate 113. The width of the beam 111 has a dimensional variation 112 due to micromachining inaccuracies. Importantly, each of the other dimensions of this device 106 would also have tolerances in their dimensions, the focus of this analysis will be the dimensional tolerance of the beam width 111.

Such a device may be used in a micromechanical resonator for a communication application or an inertial sensor, such as an accelerometer or gyroscope. If it is assumed that the desired design width 111 of the device 106 is 5 microns, a typical variation 112 that would be seen in this width dimension 111 using standard surface MEMS micromachining methods would be around 0.5 microns or more. This translates into a relative tolerance of the MEMS device of 10%, or nearly 400 times worse than that obtainable with the macroscale machining example of FIG. 2.

Relative tolerance of width of surface micromachined fixed-fixed beam=[0.5×10$^{-6}$ m)/(5×10$^{-6}$ m)]×100%=10%

Importantly, if the fabrication technique used nanofabrication methods, wherein the critical dimensions are small by one or more orders of magnitude, the relative tolerances typically will progressively degrade as the dimensions are reduced.

Moreover, depending on the physics of the device, the relative tolerances will often have a larger than simple first power impact on the performance of a micro- or nano-device or -structure. Specifically, the specific physics of a micro- or nano-device or -structure can magnify the impact of the lack of precision on the device performance.

For example, see FIG. 4, in which a cross section of a flow channel 120 is shown having a differential pressure $\Delta P=P_1-P_2$ driving a fluid through the channel 132 having length (L) 124, and radius (r) 122. If the flow is well developed (i.e., has a parabolic velocity profile 130) the volumetric flow rate, Q (units of m$^3$/s) in a fluidic channel 132 is given by the Hagen-Poiseuille equation, as follows[1]:

[1] Transport Phenomena. R. B. Bird, W. E. Stewart, and E. N. Lightfoot, John Wiley and Sons, New York, 1960.

$$Q=[(\pi*r^4)|\Delta P|]/[8*\mu*L]$$

where r 122 is the radius of the channel (in units of meters), $\Delta P$ is the differential pressure across the channel (in units of Pascals), μ is the dynamic viscosity of the fluid in the channel (in units of Pascal-Seconds), and L is the length of the channel 124 (in units of meters). As can be seen from this equation, the volumetric flow rate in a commonly used microfluidic element is dependent on the fourth power of the radius. Therefore, any lack of precision in the radius of the microchannel will have a fourth-power effect on the flow rate through the microchannel. For example, a microchannel radius that has a relative tolerance of 10% will result in a variation of flow rate Q of 40%.

Similarly, the mechanical stiffness, and therefore the resonant frequency, of a beam 107 is dependent on the thickness 109 of the beam cubed if the motion is orthogonal to the substrate surface, as in the example of the suspended beam structure example in FIG. 3. Therefore, the precision of the resonant frequency is highly dependent on the relative tolerance of the beam thickness. In yet another frequently seen element in MEMS technology, the deflection of a thin membrane clamped along each side, which is a commonly used configuration for implementation of pressure sensors, varies to the fourth power of the edge length of the membrane and inversely to the cube power of the membrane thickness. The cumulative effect of large variations in the dimensions of all of these critical elements is very significant. The impact of the lack of precision on the device physics for various types of devices is illustrated in table 138 of FIG. 5. It is also important to note that for most micro- and nano-fabrication processes, the precision of dimensional control degrades as the size of the critical elements is made smaller. As these examples serve to demonstrate, micro- and nano-fabrication allows the implementation of miniaturized mechanical devices, but does not allow the dimensions of the devices to be made precisely or the resulting device properties to be accurately controlled[2].

[2]MEMS Process Integration, M. A. Huff, S. F. Bart, and P. Lin, Chapter 14 of MEMS Materials and Processing Handbook, Ed. R. Ghodssi and P. Lin, Springer Press, New York, March 2011.

The lack of precision in micro- and nano-fabrication and manufacturing has huge implications throughout these technologies. As shown in FIG. 6, the manufacturing process 140 for the fabrication of micro- and nano-devices and structures is essentially an open-loop manufacturing process. That is, the fabrication process sequence and the parameter settings of the process sequence (i.e., tool settings, process recipes, etc.) are first defined at step 142 and set, and then the devices are fabricated at step 144. Quality control during the manufacturing process typically involves performing metrology measurements at step 146 of the critical dimensions using statistical sampling on various devices and substrates at pre-selected events during the process sequence. However, only at the very end of the manufacturing process is the device performance measured at step 148. Any deviations seen in the metrology measurements at step 146 of the critical dimensions taken during the fabrication process at step 144 may be used to tweak the process sequence or tool parameters at step 142, but may come at the loss of the substrates partially processed up to that point in the process sequence. More importantly, the ultimate performance measured at step 148 of the devices is not known until after the fabrication process 144 for a batch is completed. This means that whole wafer lots can be lost if the performance falls out of the acceptance range. Additionally, there is significant time and cost required to adjust the manufacturing process in an attempt to increase the number of devices with an acceptable performance level (i.e., obtain a higher yield).

Ultimately, the goal of micro- and nano-device and structure manufacturing, like the manufacturing of any product, is to tighten the spread of the variations in the critical dimensions and to reduce the amount of bias offset. This has two effects: it lowers costs (because of the increased yield) and increases performance. This is portrayed in FIG. 7, in which in FIG. 7 (a) shows a Gaussian bell curve 150 that would be the expected statistical variation seen in a large sampling of fabricated devices with respect to the dimensions of critical elements of a device or in the variations of devices' performance levels. The width of the Gaussian curve 150 is a measure of how much variation occurs in the manufacturing process. A wider Gaussian curve represents a manufacturing process having a larger variation (and lower performance) such as shown in FIG. 7 (a), and a narrower Gaussian curve 152 would represent a manufacturing process having a small variation (and higher performance) such as shown in FIG. 7 (b). For each Gaussian curve, the percentages of devices falling with each range. For example, between the average or mean $\mu$ and the first standard deviation, $1\sigma$ on either side, the number of devices in this range would be 68.2%.

In FIG. 7 (a), an acceptance range 154 has been superimposed. The acceptance range 154 is the range of devices having a performance level that is acceptable for a given application or product. The acceptance range 154 sets the dimensional tolerances required for a given product, and by association, the resultant product performance. A narrower acceptable range will be associated with less dimensional variations (i.e., more precision in the dimensions) and higher performance, and vice versa. As shown in FIG. 7, the statistical variation is larger in FIG. 7 (a) (i.e., the Gaussian curve 150 is wide) and there is a bias offset in FIG. 7 (a). That is, the centerline of the Gaussian curve 150 does not line up with the centerline of the acceptance range 154 resulting in a difference 153 in the centerlines shown in FIG. 7(a). Consequently, the overlap 158 of the acceptance range 154 and Gaussian curve 150 is rather minimal and the manufacturing yield 158 is very low. In comparison, the Gaussian distribution 152 in FIG. 7 (b) is much narrower and there is no bias offset in FIG. 7 (b) and the overlap 159 between the two indicates a high yield.

Current fabrication technologies used in implementation strive to adjust the processes with the goal of reducing the bias offset 153. This has the effect of shifting the Gaussian curve 150 so that it overlays the acceptance range 154. However, this comes at the expense of much longer and more costly development times. Depending on the width of the acceptance range 154 or 156, some fraction of the devices 158 produced will fall inside the acceptance range 154 or 156. High performance applications typically have an extremely tight (i.e., narrow width) acceptance range 156.

It is also desired in any manufacturing process that the statistical variations are reduced, that is the Gaussian distribution of the devices is made more narrow. For example, Gaussian curve 152 of FIG. 7 (b) has much less statistical spread (i.e., the width of the Gaussian curve 152 is much narrower). Additionally, as shown in FIG. 7 (b), the Gaussian curve 152 centerline coincides with the acceptance range 156 centerline, resulting in a very high manufacturing yield 159. A narrower Gaussian curve 152 is obtained by using more precise manufacturing processes.

A manufacturing process represented by FIG. 7 (b) would be much more desired than that shown in FIG. 7 (a). Unfortunately, current fabrication techniques used to make micro- and nano-devices and structures do not allow precision to be obtained in the device's dimensions. Importantly, a manufacturing process having low levels of precision will be considerably more expensive, because of the low yields, to produce high performance devices or structures.

The lack of precision in the fabrication of micro- and nano-devices and structures also has a direct effect on the time and cost to market. FIG. 8 is a plot 160 based on the analysis of how many total devices would need to be fabricated (plotted on y-axis) in order to get some number of acceptable devices as a function the ratio of the width of the manufacturing function (essentially the half width of the Gaussian distribution of the manufacturing process) and the width of the acceptance function (plotted on x-axis). It is important to note that this plot considers only one device parameter in the analysis (such as the width of a beam) and for a case when the device physics has a power of one in the device parameter. As can be seen in FIG. 8, lithe ratio along the x-axis is 10, nearly $10^3$ devices must be fabricated in order to yield one acceptable device[3]. This might translate into 100 or more iterations of the process sequence with 10 or more wafers in each process run. Importantly, this is a highly simplified and highly idealistic example, since most micro- and nano-devices and structures would have more than one critical element or feature that would need to have precisely controlled dimensions, and for many of these features the dimensions would have a higher power relationship to the physical behavior as illustrated in FIGS. 4 and 5 and discussed above. Nevertheless, FIG. 8 clearly demonstrates the strong relationship between lack of precision, yield, development time, and cost and that lack of manufacturing precision will require many more iterations of the device fabrication process during development as well as lower yield. Both result in higher costs.

[3]F. G. Serpa, E. Feick, and J. D. Evans, "Computation investigation of the relationship between fabrication precision and the difficulty of process development for a Micro Electromechanical Systems (MEMS) dependent upon a singe processing parameter," Booz Allen Hamilton study performed for DARPA.

The manufacturing variations that are typically most important in micro- and nano-devices and structures are the geometric variations caused by the inherent inaccuracies of the fabrication processes. There are three major sources for geometric variations: planar dimension changes (from lithography and etching), planar location offsets (from misalignment), and vertical dimension changes (from thin film or substrate thickness variation). With regard to the lithographic processes that produce the in-plane geometry of most micro- and nano-devices and structures, in general, this lithography is performed using a patterned mask in optical equipment that transfers the desired pattern to a chemical photoresist on the device wafer. This process has limited resolution due to the fundamental resolution of the mask and the focusing ability of the optical system. Moreover, there will be alignment or registration errors between the mask and the features on the substrate that are used to align the substrate to the mask. The geometric resolution is further reduced by the optical and chemical properties of the photoresist material. Additionally, the underlying material layer that is to be patterned will not have a perfectly uniform thickness across the substrate. And finally there is the behavior of the etch process itself to transfer the mask pattern into a layer on the substrate. No etch process is perfectly anisotropic, and therefore, there will invariably be some difference between the mask and the underlying etch profile. In practice, the inaccuracy of the transfer between the CAD drawing of the design and the actual as-fabricated structure is the cumulative sum of these collective errors[4].

[4]MEMS Process Integration, M. A. Huff, S. F. Bart, and P. Lin, Chapter 14 of MEMS Materials and Processing Handbook, Ed. R. Ghodssi and P. Lin, Springer Press, New York, in publication and to be released in 2010.

The result of these errors is that the micro- and nano-devices and structures, as fabricated, will not be a perfectly precise representation of the device design, as drawn in the mask layout in either its dimensions or shape. For example, if one is designing a MEMS-based comb-finger based variable capacitance structure, the width of the gaps between the fingers is directly proportional to the capacitance. A typical photolithography-defined pattern followed by a chemically-based etch process will typically result in comb-fingers that are slightly narrower than as drawn in the mask layout. The amount that the comb-fingers are thinner will vary from device to device, from wafer to wafer, and from lot to lot. Moreover, the lack of precision of the pattern transfer process to implement the comb-fingers that results in a decreased capacitance may also lead to other performance degrading effects. That is, the comb-finger variable capacitor may be part of an accelerometer whose mechanical stiffness is formed from the same material layer as the comb fingers. The same manufacturing variation that causes a reduced sensitivity due to an increase in the comb-finger gap may also result in an increased sensitivity due to reduced suspension stiffness.

Further, the amount of lateral etch observed in a material layer (i.e., the amount of undercut of the masking layer) will vary depending on the material used in the layer, the type of etch process used (both equipment and process recipe), the depth of etch, the amount of over-etch required, and loading effects due to the amount of substrate area being etched. Most wet chemical etchants are isotropic and will undercut the masking layer very significantly during an etch process resulting in poor dimensional control. Reactive Ion Etching (RIE), particularly Inductively-Coupled Plasma (ICP) RIE processes, such as Deep Reactive Ion Etching (DRIE), are much more anisotropic and therefore the amount of undercutting of the mask will be greatly reduced compared to wet etching. However, the relative tolerance is still very large compared to the macro-scale machining domain.

There are several reasons for the dimensional variations seen in RIE etch processes. One reason is due to the inherent "lateral etch" of any etch process. Even for DRIE, which has a surface polymerization in each cycle of the etch process to protect the sidewall erosion, the aspect ratio of lateral etch is typically 15 to 1. Therefore, a feature that is made using DRIE etching that is 15 microns in height will have its width reduced by 2 microns (1 micron on each side). Also, etches of all types have a characteristic called "loading effect." This refers to the effect on the material etching characteristics due to the presence or lack of adjacent material also being etched as well as the overall amount of material being etched. The etch of a finely spaced pattern of lines and spaces will be slower than the etch of a material with larger features. The most common way to compensate for this etch rate dependence is to over-etch the sample to allow complete etching even for the smallest feature sizes. However, one effect of over-etching is that any tight dimensional control of the features that cleared first will be lost.

Like the planar dimensions described above, variations in material thicknesses also have a strong effect on device performance. In many micro- and nano-devices and structures fabrication processes, the thicknesses of the material layers are highly dependent on the type of process employed to deposit the layer. For example, many thin-film deposition methods, such as LPCVD and PECVD, have an across-wafer thickness non-uniformity of at least a few percent or more. Additionally, there will be some variation from the nominal film thickness desired and the actual thickness after deposition. Similarly, methods of wafer bonding and thinning-back to create single-crystal silicon layers having a thickness of a few microns or more, can often have a variation from wafer-to-wafer of at least 0.5 microns or more, which can translate into relatively large relative tolerances for thin device layers. Like the method to compensate for etch loading effects, the most common method to compensate for material thickness variations in the etch process is to over-etch the substrate to allow complete etching of the material layer across the wafer. Again, this has the effect of loss of control of the dimensions of the features being made in the material layer[5].

More precise methods for development and manufacturing of micro- and nano-devices and structures are clearly needed for high performance applications, as well as to enable lower development time and cost. The present invention is directed toward a system and method for improved manufacturing that will greatly improve the precision of the fabrication of micro- and nano-devices and structures. The present invention has the effect of controlling the dimensions for fabrication much more tightly, thus leading to greatly improved device performance, increased manufacturing yields and lowered production costs, as well as reduced time and cost of device development. The present invention combines new precision micro- and nanomachining capabilities with real-time metrology and closed-loop control of the machining processes to achieve unprecedented machining precision at acceptable device manufacturing through-puts.

The present invention combines one or more fabrication capabilities into a single fabrication tool system 10, as shown in FIG. 1. These new or existing fabrication capabilities are the femto-second laser machining of tool 12; the Plasma Focused-Ion Beam (PFIB) machining of tool 18; the Focused-Ion Beam (FIB) machining of tool 18; and the conventional laser micromachining capability of tool 30.

FIG. 1 is a drawing of the present invention showing the major system components of system 10 that enable precision fabrication at the micro- and nano-scale to be implemented. The system 10 shown in FIG. 1 includes a precision-controlled platform stage 40 on which a substrate to be machined 52 is positioned. The platform stage may include a vacuum chuck (not shown) to hold down the substrate 52. The platform stage 40 is precisely moved in the lateral and angular directions via a multiple degree of freedom movement stage 70. Preferably, the movement stage 70 has 6-degrees of freedom in its movements and precise movement and positional accuracy. The machining system 10, including the machining capabilities, are located inside a chamber 51, in which a partial vacuum 50 can be drawn while the machining processes are being performed. Preferably, a load-lock chamber, which allows the substrate 52 to be inserted into the chamber 50 for machining and taken out without having to break vacuum inside the chamber 50, would be used. Cassette-to-cassette loading and un-loading tools can be used in the system of FIG. 1 to increase substrate through-put.

The femto-second laser machining capability 12 is used for removal of substrate 52 material(s) at rates higher than is possible with either the PFIB or FIB capabilities, but with higher levels of precision than possible with a conventional laser machine tool capability. The plasma focused-ion beam PFIB machining tool capability 18 is used to remove substrate 52 material(s) at lower rates, but with higher levels of resolution and precision than either the femto-second or conventional laser machine tool capabilities. The PFIB capability can also be used as a conventional FIB tool capability in which the removal rates on substrate material(s) are lower than possible with the PFIB, but with a resolution and precision of material removal that is higher than the PFIB. The conventional laser machining tool capability 30 is used to remove substrate 52 material(s) at higher rates, but with limited resolution and precision as compared to the femto-second laser 12, PFIB 18, or FIB 18.

The femto-second laser machine tool 12 may include a focusing lens element 14 that allows the laser's radiation beam 16 and resultant spot size on the substrate 52 surface to be reduced in diameter and the intensity of the laser's radiation beam 16 to be increased to thereby accelerate the removal rates. Similarly, the conventional laser machine tool 30 may also include a focusing lens element 32 that allows the laser's beam 34 and resultant spot size on the substrate 52 surface to be reduced in diameter and also the laser radiation intensity to be increased, to thereby accelerate the removal rates. Preferably, both the femto-second tool 12 and conventional laser machine tool 30 employ lens elements 14 and 32 that have automatic adjustment that is connected in the close-loop control loop system 20, in which the laser beams 16 and 34 and resultant spot sizes are automatically adjusted in real-time to optimize the removal rates and precision of the machining processes for a specific device. These lens elements also allow the minimum resolution possible, that is, the smallest feature that can be machined into the substrate, with these capabilities to be reduced. Therefore, when combined with the automatic closed-loop control, the feature sizes of the machining processes can be adjusted for optimal results based on a given design and material type being machined.

The PFIB machine tool 18 includes one of more process gas lines with a plasma source 20 in close proximity to the FIB 18 output to generate the PFIB beam 22. Preferably, the PFIB machine tool 18 employs a close-loop control loop system, in which the ion beam size 22 and resultant ion beam spot size on the substrate 52 surface are automatically adjusted using electronic lens elements in real-time to optimize the removal rates, minimum feature size and precision of the machining process for a specific device design. Preferably, the PFIB and FIB machine tool capabilities both employ a close-loop control loop system 20 to automatically optimize the removal rates and precision of the machining process for a specific device(s).

The closed-loop control system 20 is connected to a computerized control system 100, in which a computer-aided design (CAD) file of a device design is inputted to control the tools 12, 18 and 30 to implement the device design. The inputted device design to be machined in the substrate 52 may include various patterns, including horizontal lines 60 and 88, as well as circular, curvilinear and irregularly-shaped features 90. The control system 100 allows the direct writing, that is the machining, of features by the tools 12, 18 and 30 without having to perform photolithography on the substrate 52 for the purposes of pattern transfer, and therefore is a more efficient fabrication process than the current conventional means of fabrication of micro- and nano-devices and structures.

The femto-second laser 12 allows reasonably high machining rates for features down to the submicron level, while the PFIB 18 would be used to machine at much higher precision levels, but at lower machining rates. These machining capabilities may be combined with a conventional laser machine tool 30 for high-rate machining (but with lower machining precision) and a Focused-Ion Beam (FIB) 18 for extremely precise machining (but at very low machining rates). Note that the PFIB 18 capability simultaneously enables the FIB 18 capability.

Conventional laser micromachining 30 is a relatively mature process technology that uses a focused optical beam 34 of light to selectively remove materials from a substrate 52, thereby creating features in the surface of the substrate 60, 88 and 90.

Conventional laser machine tool 30 technologies include Nd:YAG; Nd: YVO4; excimer; etc. The advantages of conventional laser micromachining include: it is a direct-write process and requires no mask or photolithography; it can be used to machine several different material types; and the machining rates are relatively high, thereby allowing reasonable wafer through-puts to be achieved. However, there are some attributes of conventional laser micromachining that limit its usefulness for the machining of features bellow a few ten's of micron-sized level. Additionally, conventional laser machining generates a heat-affected-zone (HAZ) with a large temperature gradient that can lead to micro-cracking, damage to the surrounding material, and re-deposition of machined material near the machining site, that limit it usefulness for the machining of features at the ten's of micron-size level.

Femto-second laser micromachining 12 is a relatively new technology that utilizes the properties of ultra-short laser pulses to achieve an unprecedented degree of control and precision in machining microstructures in a wide class of different material types without heating or damaging the surrounding material. The use of femto-second laser 12 allows the photon energy to be deposited into small volumes by a multi-photon nonlinear optical absorption, which directly leads to avalanche ionization. Because the typical heat diffusion time is in the order of a nanosecond to a microsecond time frame, and the electron-phonon coupling time of most materials are in the picosecond to nanosecond time frame, the femto-second laser energy is deposited on a time scale much shorter than either the heat transport or the electron-phonon coupling. Consequently, the area of material where the laser pulse is deposited is directly converted from a solid to vapor phase and to plasma formation nearly instantaneously—that is, it is an ablation process. As compared to conventional laser micromachining 30, femto-second laser 12 machining greatly reduces the damage to the substrate 52 in locations in close proximity to the machining site 60, 88 and 90. Moreover, since the machining process is not dependent on the linear absorption at the laser wavelength, virtually any dielectric, metals, and mechanically hard materials can be machined using the same laser system 12. Also, the breakdown threshold of femto-second lasers 12 can be determined with great accuracy, thereby making it a deterministic machining technology.

Some of the differences between conventional laser micromachining 30 and femto-second laser micromachining 12 are illustrated in FIG. 9 and described further below. FIG. 9 (a) shows the effect of conventional laser 30 (continuous, quasi-continuous, Q-switched, etc.), that is, a laser beam 34 having a pulse length longer than about 10 picoseconds, when used to micromachine a substrate 52. The conventional laser beam 34 may be focused using a lens element 32 into a smaller diameter beam 34 having higher laser radiation intensity.

The conventional laser machine tool 30 is limited to machining features above the ten's of microns dimensional scale for reasons explained below. Conventional laser machining 30 results in heating of the substrate 52 that creates a melt zone 175 at the impingement site 176 and the molten material 177 is ejected away from the impingement site 176. This process causes localized heating in a heat transfer zone 183 of the surrounding material around the impingement site 176 resulting in a melt zone 175 area in immediate proximity of where the laser beam impinges 176. A large thermal gradient is established between the impingement site 176 and the substrate 52 material away from the impingement site 176. This may result in the formation of microcracks 178 near the impingement site 176 where the machining is being performed. Also, the molten material 177 ejected from the impingement site 176 can condense on the nearby surfaces creating a debris field 179. Some of the molten material 175 also creeps upward from the machining or impingement site 176 and cools to create a recast layer 181. This recast material 181 is highly porous and usually undesirable for any device application. The underlying surface layer of the melt zone 175 near the impingement site 176 may also have ripples in it due to the thermal shock wave 182 resulting in plastic deformation of the substrate material 52 near the impingement site 176. Since the melt zone 175 is larger than the beam spot size 34, it is very difficult for a conventional laser machine tool 30 to be used to machine features below a few microns in diameter. The conventional laser machining tool 30 works best on substrates 52 materials having ample free electrons, such as metals and semiconductors, but does not work very well on substrate 52 materials with a limited number or no free electrons, such as dielectrics. These free electrons are necessary to initiate the avalanche ionization of the material of the substrate 52. In short, conventional laser machining 30 results in a large debris field 179 and damages the substrate 52 material around the impingement site 176 where the machining is performed conventional laser machine tools 30 do not work well on some commonly used substrate 52 materials commonly used in micro- and nano-device and structure fabrication, such as glasses, dielectrics and some ceramics. It cannot machine features below a few microns. Nevertheless, the conventional laser machine tool 30 does have a high removal rate depending on laser intensity, wavelength and substrate material 52 type.

In comparison, a femto-second micromachining tool 12 (FIG. 9b) can ablate or vaporize the substrate 52 material at the location 188 where the laser beam 16 impinges 188 the substrate 52. Since the laser pulse length is shorter than either the heat diffusion time scale or the time scale for electron-phonon coupling, the substrate material 52 surrounding the impingement site 188 does not heat up and no thermal gradient is established. Therefore, no thermal shocks or microcracks are created in the process. The femto-second laser beam 16 can be focused onto the substrate surface 52 using a lens element 14. The intensity levels of femto-second lasers 12 are very high, reaching TWatts per $cm^2$. Therefore, the material temperature at the impingement area 188 instantaneously goes into the plasma regime. The intensity levels of femto-second lasers 12 are so high that no materials, even those with very high melting temperatures, such as Molybdenum, can withstand these energy levels. Importantly, femto-second machining by laser 12 does not result in the debris field near the impingement site 188 found in conventional laser machining by laser 30. This is because the plasma created by the femto-second laser 12 energy results in a pressure gradient that forces the ablated material away from the plasma plume. Additionally, there are electrical forces that propel the ablated material from the impingement site 188. The plasma contains ionized species that have a positive charge, which repel one another. These ions can be pumped from the site similar to how a RIE etch process works. As a result, there is none of the surface debris found in conventional laser machining by laser 30. Furthermore, the extremely high intensity of the femto-second laser 12 results in bound electrons becoming free electrons and therefore can initiate the avalanche ionization process immediately. Therefore, femto-second lasers 12 can be used effectively on any material type, including metals, semiconductors, dielectrics, polymers and ceramics.

Importantly, the femto-second laser 12 is capable of machining sub-micron features. In fact, a femto-second laser 12 can be used to machine features less than the wavelength of the laser radiation. The reason for this is that femto-second laser 12 machining is a threshold process. That is, the beam impingement area intensity has a Gaussian profile with the peak intensity at the center and falling to lower values toward the beam edge. Therefore, if the beam intensity is adjusted so that only a portion of the beam is above the threshold for ionization then the machining only occurs in this location.

With this method, features below 1 micron can be made in a material substrate, and possibly smaller, depending on the wavelength of the laser source. This is illustrated in FIG. 10 where the threshold intensity 190 for the onset of ablation for a specific laser and material substrate 52 is shown. Any intensity below the threshold intensity 190 will not ablate the substrate material 52 and any intensity above the threshold intensity 190 will result in ablation. Two different laser intensities as shown, one with a higher intensity 191 and another with a lower intensity 193. Only the intensity levels of each beam profile above the threshold intensity 190 results in ablation, and therefore, as shown in FIG. 10, the laser profile with the higher intensity 191 results in a larger machined feature 192 in the substrate 52. Similarly, the laser profile with the lower intensity 193 results in a smaller machined feature 194 in the substrate 52. Using this technique of laser threshold adjustment, features of approximately $\frac{1}{10}^{th}$ to $\frac{1}{20}^{th}$ of the wavelength of the laser system can be machined into the substrate. Therefore, depending on the specific radiation wavelength of the femto-second laser 12, features as small as about 100 to 200 nanometers can be machined into the substrate 52 surface.

Importantly, the machining rate using a femto-second laser 12 can be as high as (and possibly higher than) $10^6$ microns/sec which is at the lower end of the rate of removal of materials, such as silicon, using techniques such as Inductively-Coupled Plasma (ICP) and Reactive Ion Etching (RIF) that are commonly used in micro- and nano-device and structure fabrication.

The femto-second laser 12 technology allows the machining of relatively small features, even down to about 100 to 200 hundred nanometers. But to achieve higher levels of precision this capability would be merged with a Plasma Focused Ion Beam (Plasma FIB) and Focused Ion Beam (FIB) 18 capability. Conventional Focused Ion Beam (FIB) milling is a mature technology that uses a liquid-metal ion source, usually a Gallium ion source, whereby the Gallium wets a tungsten needle that is heated and has a large electrical potential to cause ionization and field emission of the Gallium ions. The source ions are accelerated to an energy usually between 5 and 50 keV and focused to a small spot size using a special electrostatic lens. As the focused beam of Ga$^+$ ions impinges on the surface of a sample, material on the surface is sputtered. This sputtered material leaves the surface as either secondary ions or neutral atoms. Secondary electrons are also produced from this process. The sputtered ions or secondary electrons can be collected to form a high-resolution image of the surface (similar to the way a Scanning Electron Microscope [SEM] works). Conventional FIB technology can machine features down to about 5 to 10 nm and can remove material at rates as high as slightly above 50 micron$^3$/sec[6].

[6] FIBs generally have higher resolution at lower removal rates and vice versa and therefore the minimum features size at a removal rate of 50 microns$^3$/sec would be around 1 micron.

In comparison, Plasma FIB technology has a significantly higher removal rate than conventional FIB technology. Plasma FIB milling works by creating a magnetically-induced plasma ion source above the sample and using the ions from the source to augment the machining rate. The plasma converts the material on the surface where the ion impingement is occurring to a volatile gas species, which can be removed through low pressure pumping. This allows the material to be removed at an increased rate without the problem of material re-deposition on the surface. Depending on the gas used, the material being machined, as well as the beam spot size, the removal rate using Plasma FIB can be as high as nearly 1,000 micron$^3$/sec. The increase in machining rate of Plasma FIB compared to FIB is shown as chart 200 in FIG. 11, where the FEI-ICP curve 202 (shown as solid straight line) is the Plasma FIB removal rate (removal rate is same as machining rate) plotted as a function of the spot size, d, and the Ga, LMIS 201 is the conventional FIB mill rate as a function of the spot size (shown as non-linear dotted line). As can be seen in the chart of 200 of FIG. 11, the machining rate for conventional FIB reaches a maximum between 10 and 100 micron$^3$/sec, whereas the Plasma FIB is linear out to nearly 1000 micron$^3$/sec. Importantly, the Plasma FIB with no injected gases can be operated as a conventional FIB as well.

FIG. 12 is a plot 300 of the feature dimension against the estimated machining rates for the micromachining processes described above that would be preferably included in the present invention machine tool 10, including a conventional laser and femto-second laser 302, a Plasma FIB 303 and FIB 304. The removal rates shown in 300 are estimated since the maximum rates possible with these technologies are continuously increasing as these technologies improve.

As can be seen, these technologies complement one another very well and collectively enable a range of feature sizes from about 10 nm up to above 10 microns (a dynamic range of feature sizes of more than 1,000) and a range of machining rates from below $10^{-2}$ micron$^3$/sec to more than $10^6$ microns$^3$/sec (a dynamic range of machining rates of more than $10^8$).

It is important to note that the maximum spot size for each machining capability does not mean that this is the largest feature that can be made with the specific tool since each of these machining systems raster scan the surface of the substrate and can be used to make nearly any sized feature. For example, conventional laser machining has a spot size of above 10 microns, but can be used to make nearly any sized micro- and millimeter sized device.

The commonly used MEMS and micro-fabrication technology of Deep Reactive Ion Etching (DRIE) is shown on FIG. 12 in the top right hand corner 301 for comparison. As can be seen, the machining technologies proposed herein can deliver machining rates comparable to current technologies, such as DRIE, but at far superior levels of precision. This is important since the maximum removal rates will determine the substrate through-put, that is, the number of substrates that can be machined per unit time and any machining technology must have substrate through-put rates comparable to current production rates. As can be seen in FIG. 12, the present invention provides machining rates comparable to the commonly used etching technology of DRIE, but with much improved level of precision. The feature dimension and removal rate of an electron-beam or Scanning Electron Microscopy (SEM) are also shown 305.

Importantly, the type and number of machining capabilities to be included in a machining system 10 configuration can be varied from one or more depending on the specific dynamic range of removal rates and level of precision in the machining process desired for a given application. Therefore, a femto-second laser combined with a PFIB machining capability may be desirable for a certain application whereas a conventional laser combined with a femto-second laser may be desirable for another application.

The type and number of machining capabilities in a specific machining system configuration would be determined based on the desired dynamic range of machining rates and the precision of the machining process desired using the plot of FIG. 12. If a dynamic range of machining rates from 1 micron$^3$/sec to $10^6$ microns$^3$/sec was desired and the machining precision desired was within the range of 200 nm and 20 microns, then a femto-second laser combined with a conventional laser would be adequate. However, if the needed machining precision level extended down to a few tens of nanometers, then the femto-second laser combined with a conventional laser would need to be combined with the PFIB and FIB. In general, the major factor determining the machining capability to be selected in a given system configuration is the minimum feature dimension. The secondary factor determining the machining capability to be selected in a given system configuration is the maximum machining rate desired.

It may also be desirable to combine several of the same machining systems, such as a multiplicity of PFIBs or femto-second lasers in the same tool system to speed up the rates for a given dynamic range of machining resolutions, For example, if two of each of the femto-second lasers and conventional lasers were configured in a single machining system, the machining precision would be set by the minimum feature dimension possible with those capabilities, that is, between a few hundred nm's to more than 20 microns. However, if two of each of the femto-second lasers and conventional laser were configured in a single machining system, the machining rates would be twice that of a system configuration with only one of each of these machining capabilities. All configurations of these machining capabilities are part of the present invention.

The precision machining tool 10 of the present invention in one preferred embodiment includes the conventional laser 30, femto-second laser 12, plasma FIB 18, FIB 18 and a Scanning Electron Microscope (SEM) 82 imaging capability in one machining tool system 10. The machining stage 40 onto which the device substrate would be positioned during the machining operation would have 6-Degrees of Freedom 70, high-precision positioning accuracy, and would be located within a vacuum chamber 50 enclosure where the machining would occur 51. Depending on the resolution of the machining processes on a machine system configuration, the stage movement may have sub-nanometer positional accuracy enabled using piezoelectric actuation mechanisms or similar means.

Each of the machining capabilities are under computer control—that is the machining process and stage position and rotation angle, would be determined by the closed loop control system 20 and computerized software system 100 so as to machine the device's dimensions and design, similar to the way modem numerical controlled machines (CNC machines) operate.

The machining process can be viewed in real-time using the electron beam gun 82 and lens element 84 that creates a scanning electron beam 86 that is under computer control 80. The secondary electrons from the substrate are captured in the secondary electron detector 15 and formed into an image 17 digitally. The data is also fed back into the computer controller 100 and the closed-loop control system 20 for controlling the machining tools 12, 18 and 30, as well as the 6-degree of freedom stage 70 that precisely moves and positions the substrate 52 during the machining process. The imaging system 15 and 17 is essentially a Scanning Electron Microscope (SEM) capability that would be included in the machine system 10 for the purposes of real-time imaging and control of the machining process. The image data from the digitally captured SEM imager 17 is used in a feedback loop to control system 20 to control the machining processes, such that the machined sample dimensions equaled "as drawn" dimensions and device shape as defined in the device CAD 100.

Elemental analysis could be enabled by incorporating energy-dispersive X-ray spectroscopy (EDAX) capability 19. This allows the feedback loop on the machining process to have information based on the makeup of the material being machined which may be useful for determining exactly where to stop the machining process. Other spectroscopic detection capabilities may also be included in the system for similar purposes of determining material types at a certain machining position. Also, the SEM 15 can be used to measure frequency of the device during the machining process. This so-called "beam-on-edge" (BOE) technique is used on SEMs to characterize vibration on the tools as illustrated on 400 of FIG. 13. The electron beam is focused on a feature having a strong contrast 401 in the image and any movement (such as from movement of the device) of the sample causes a modulation in the imaging signal that can be processed through a fast-fourier transform (FFT) 402 to extract the frequency spectrum of the sample movement. From this spectrum the drive frequency and mechanical resonant frequencies 403 can be identified. This technique can be used to detect movement amplitudes of about 1 nm in any direction. This technique can be used to enable direct measurement of the actual device resonance frequency as the feedback signal for closed loop process control.

The machine tool of the present invention that incorporates each of these capabilities functions as follows: the user loads into the tool the CAD design of the micro- or nano-device or structure to be made; a substrate of the desired material type 52 or having the desired material layers would be loaded into the machine tool by placing it onto the precision stage 40; the conventional laser 30 performs the coarse machining of the device, removing large sections of material very quickly (at a rate similar to DRIE in silicon). The conventional laser 30 is then turned off once the machined features had reached a level equivalent to the resolution of the conventional laser 30 or moved to another position on the substrate 52 for the purposes of machining other locations of the substrate 52. The femto-second laser 12 is then turned-on and machines the sample at a finer scale. The femto-second laser is then turned off once the machined features have reached a level equivalent to the resolution of this capability or moved to another position on the substrate 52 for the purposes of machining other locations. Then the Plasma FIB is turned-on and machines at a finer scale until it reaches the limit of the resolution of the features possible with the plasma FIB or moved to another position on the substrate 52 for the purposes of machining other locations; and then the FIB is used to essentially perform the finest machining and polishing of the device. The feedback loop of the machining process can be based on the dimensional measurements enabled by the SEM, the BOE of the device during machining, and/or a chemical analysis of the material as it is being machined.

It is possible to have more than one of these capabilities machining simultaneously to further increase throughput of the system 10. It may be possible that the machining capabilities machine simultaneously to thereby accelerate the machining rates and substrate through-put. The machining capabilities of the system 10 which allow a large dynamic range of machining rates and a large dynamic range of machining resolutions (see FIG. 12), when combined with real-time in-situ metrology and high precision positioning control with 6 degrees-of-freedom of the substrate during the machining process, allows the manufacturing variations that are typically most important in micro- and nano-devices and structures caused by the inherent inaccuracies of the fabrication processes as discussed above, to be greatly reduced. This is illustrated in the diagram of 500 in FIG. 14. Three types of manufacturing processes are represented in 500. The first manufacturing process 501 is a completely open-loop manufacturing process in which the performance is only known after the devices have been made. This is essentially how micro- and nano-device and structure fabrication is currently performed. The second manufacturing process 502 employs a feedback loop on measurement of the device geometry and the yield of this process is improved over that of the open-loop process 501. The third manufacturing process 503 employs capability for measurement of the device performance, such as resonant frequency, during the manufacturing process using a feedback loop from the measured device performance to the process settings and would have a higher yield as compared to the open-loop process. The present invention is able to combine the second 502 and third 503 closed-loop manufacturing process into the overall manufacturing process thereby enabling very high production yields compared to open-loop methods as illustrated at the bottom in FIG. 14.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A system for fabricating micro- and nano-devices and structures, the system comprising:
    a platform stage on which a substrate is positioned and moved during machining,
    a femto-second laser for performing machining on the substrate,
    a focused-ion beam for performing machining on the substrate,
    a plasma focused-ion beam for performing machining on the substrate, and
    a conventional laser for performing machining on the substrate,
    the micro- and nano-devices and structures including: Micro-Electro-Mechanical Systems (MEMS); Nano-Electro-Mechanical Systems (NEMS); Microsytems; Nanosystems; Photonics; 3-D integration, heterogeneous integration; and Nanotechnology devices and structures,
    the micro- and nano-devices and structures having a range of depth, lateral or depth and lateral dimensions ranging from nanometers to millimeters.

2. The system of claim 1, further comprising a movement stage to move the platform stage in lateral and angular directions.

3. The system of claim 2, wherein the movement stage has six degrees of freedom in its movements and well as precision positional accuracy.

4. The system of claim 2, wherein the movement stage has high precision positional accuracy using piezoelectric actuators.

5. The system of claim 1, further comprising a chamber in which the platform stage and machining capabilities are located, and thus, the machining of the substrate is performed, and in which a partial vacuum can be drawn while the machining of the substrate is performed.

6. The system of claim 5, further comprising a load-lock chamber for inserting the substrate into the vacuum chamber for machining and removing the substrate out of the vacuum chamber without breaking the vacuum inside the chamber.

7. The system of claim 1, further comprising a Scanning Electron Microscope (SEM) for providing imaging capability with respect to the a platform stage on which a substrate is positioned.

8. The system of claim 1, wherein the platform stage on which a substrate is positioned is further comprised a vacuum chuck to hold down the substrate.

9. The system of claim 1, wherein the femto-second laser has machining rates for the removal of material from the substrate that are higher than possible with either the plasma focused-ion beam or the focused-ion beam, and wherein the femto-second laser has machining resolution and precision levels for the removal of material from the substrate that are higher than possible with the conventional laser.

10. The system of claim 1, wherein the plasma focused-ion beam has machining rates for the removal of material from the substrate that are lower than possible with either the femto-second laser or the conventional laser, and wherein the or the focused-ion beam has machining resolution and precision levels for the removal of material from the substrate that are higher than possible with the femto-second or the conventional laser.

11. The system of claim 1, wherein the plasma focused-ion beam can also be used as a conventional focused-ion beam in which it has machining rates for the removal of material from the substrate that are lower than possible with either plasma focused-ion beam, and wherein the or the focused-ion beam has machining resolution and precision levels for the removal of material from the substrate that are higher than possible with the plasma focused-ion beam.

12. The system of claim 1, wherein the conventional laser has machining rates for the removal of material from the substrate that are higher than possible with either the plasma focused-ion beam, the focused-ion beam or the femto-second laser, and wherein the conventional laser has machining resolution and precision levels for the removal of material from the substrate that are lower than possible with the plasma focused-ion beam, the focused-ion beam or the femto-second laser.

13. The system of claim 1, wherein the femto-second laser further comprises a focusing lens element that allows a radiation beam of the femto-second laser and a resultant spot size on the substrate surface to be reduced in diameter and the intensity of the femto-second laser's radiation beam to be increased to thereby accelerate the rates of removal of material from the substrate by the femto-second laser's radiation beam.

14. The system of claim 1, wherein the femto-second laser further comprises a focusing lens element that allows a radiation beam of the femto-second laser and a resultant spot size on the substrate surface to be reduced in diameter and the intensity of the femto-second laser's radiation beam to be increased to thereby minimize the feature size that can be machined with the femto-second laser's radiation beam.

15. The system of claim 1, wherein the conventional laser further comprises a focusing lens element that allows a radiation beam of the conventional laser and a resultant spot size on the substrate surface to be reduced in diameter and the intensity of the conventional laser's radiation beam to be increased to thereby accelerate the rates of removal of material from the substrate by the conventional laser's radiation beam.

16. The system of claim 1, wherein the conventional laser further comprises a focusing lens element that allows a radiation beam of the conventional laser and a resultant spot size on the substrate surface to be reduced in diameter and the intensity of the conventional laser's radiation beam to be increased to thereby minimize the feature size that can be machined with the conventional laser's radiation beam.

17. The system of claim 1 further comprising a close-loop control system.

18. The system of claim 17, wherein the conventional laser further comprises a lens element with an automatic adjustment that is connected to the close-loop control system which automatically adjusts in real-time the laser beam and resultant spot size of the conventional laser to optimize the removal rates and precision of the machining by the conventional laser for a specific device.

19. The system of claim 17, wherein the femto-second laser further comprised a lens element with an automatic adjustment that is connected to the close-loop control system which automatically adjusts in real-time the laser beam and resultant spot size of the femto-second laser to optimize the removal rates and precision of the machining by the femto-second laser for a specific device.

20. The system of claim 17, wherein the plasma focused-ion beam further comprised a lens element with an automatic adjustment that is connected to the close-loop control system which automatically adjusts in real-time the focused-ion beam and resultant spot size of the plasma focused-ion beam to optimize the removal rates and precision of the machining by the plasma focused-ion beam for a specific device.

21. The system of claim 17, wherein the focused-ion beam further comprised a lens element with an automatic adjustment that is connected to the close-loop control system which automatically adjusts in real-time the focused-ion beam and resultant spot size of the focused-ion beam to optimize the removal rates and precision of the machining by the focused-ion beam for a specific device.

22. The system of claim 17 further comprising a computerized control system connected to the closed-loop control system.

23. The system of claim 22, wherein the computerized control system has a computer-aided design (CAD) file of a device design inputted to control the lasers and ion beams to implement the device design.

24. The system of claim 23, wherein the inputted CAD file is a device design to be machined into the substrate that includes various patterns.

25. The system of claim 24, wherein the various patterns that can be machined into the substrate include horizontal lines and circular, curvilinear and irregularly-shaped features.

26. The system of claim 24, wherein the computerized control system using the CAD file controls the lasers and ion beams so as to implement the machining of features on the substrate by the lasers and ion beams without the need to perform photolithography on the substrate for the purpose of pattern transfer.

27. The system of claim 23, wherein the computerized control system using the CAD file controls the lasers and ion beams so as to implement the direct writing of features on the substrate by the lasers and ion beams.

28. The system of claim 1, wherein the femto-second laser is capable of machining sub-micron features on the substrate.

29. The system of claim 1, wherein the femto-second laser is capable of machining sub-micron features on the substrate using sub-threshold intensity adjustment of the laser's radiation beam intensity.

30. The system of claim 1, wherein the femto-second laser has a machining rate of $10^6$ microns$^3$/sec.

31. The system of claim 1, wherein the femto-second laser has a machining rate down to a few hundred nanometers.

32. The system of claim 1, wherein the focused-ion beam laser has a machining rate between 10 and 100 micron$^3$/sec.

33. The system of claim 1, wherein the plasma focused-ion beam has a machining rate, depending on the gas used to operate the plasma focused-ion beam laser, the type of material being machined, the plasma focused-ion beam's spot size, as high as 1,000 micron$^3$/sec.

34. The system of claim 22, wherein the computerized control system through the closed-loop control system controls and operates in combination (i) the femto-second laser at a submicron machining precision level, and (ii) the plasma focused-ion beam at a machining precision level that is higher than the submicron precision level, but at a machining rate lower than the femto-second laser's machining rate.

35. The system of claim 34, wherein the computerized control system through the closed-loop control system further controls and operates in combination with the femto-second laser and the plasma focused-ion beam (iii) the conventional laser at a machining rate higher than the femto-second laser's machining rate, but at a machining precision level lower than the femto-second laser's precision level, and/or (iv) the focused-ion beam at a machining precision level that is higher than the plasma focused-ion beam's precision level, but at a machining rate lower than the plasma focused-ion beam's machining rate for extremely precise machining, but at very low machining rates.

36. The system of claim 35, wherein the computerized control system through the closed-loop control system controlling and operating in combination (i) the femto-second laser, (ii) the plasma focused-ion beam, (iii) the conventional laser, and/or (iv) the focused-ion beam achieves the machining of a range of features sizes from about 10 nm up to above 10 microns, which is a dynamic range of feature sizes of more than 1,000, and a range of machining rates from below $10^{-2}$ micron$^3$/sec to more than $10^6$ microns$^3$/sec, which a dynamic range of machining rates of more than $10^8$.

37. The system of claim 1, wherein the conventional laser is a ND:YAG laser, a ND:YVO4 laser or an excimer laser.

38. The system of claim 35, wherein the computerized control system through the closed-loop control system controls and operates in combination (i) the femto-second laser, (ii) the plasma focused-ion beam, (iii) the conventional laser, and/or (iv) the focused-ion beam, to achieve a predetermined dynamic range of removal rates and resolution selected for a predetermined application.

39. The system of claim 1 further comprising a plurality of plasma focused-ion beam and/or a plurality of femto-second lasers in a single tool system to speed up the machining rates for a predetermined dynamic range of machining resolutions.

40. A system for fabricating micro- and nano-devices and structures, the system comprising a platform stage on which a substrate is positioned and moved during machining and a plurality of lasers and/or ion beams capable of achieving predetermined levels of machining resolution and precision and machining rates for a predetermined application, the micro- and nano-devices and structures including: Micro-Electro-Mechanical Systems (MEMS); Nano-Electro-Mechanical Systems (NEMS); Microsytems Nanosystems Photonics 3-D integration; heterogeneous integration; and Nanotechnology devices and structures, the micro- and nano-devices and structures having a range of depth, lateral or depth and lateral dimensions ranging from less than 10 nanometers to a plurality of millimeters.

41. The system of claim 40, wherein the plurality of machining capabilities comprises a femto-second laser and a plasma focused-ion beam for achieving the predetermined levels of machining resolution and precision and machining rates for the predetermined application.

42. The system of claim 40, wherein the plurality of lasers comprises a femto-second laser and a conventional laser for achieving the predetermined levels of machining resolution and precision and machining rates for the predetermined application.

43. The system of claim 40, wherein the plurality of lasers comprises a plurality of the same type of laser.

44. The system of claim 40, wherein the plurality of focused-ion beams comprises a plurality of the same type of focused-ion beams.

45. The system of claim 40, wherein the plurality of machining capabilities comprises a plurality of femto-second lasers or a plurality of plasma focused-ion beam to increase the machining rate for a predetermined dynamic range of machining resolutions.

46. A system for fabricating micro- and nano-devices and structures, the system comprising a platform stage on which a substrate is positioned and moved during machining, a close-loop control system and at least one laser or ion beam which is controlled and operated by the close-loop control system so as to be capable of achieving predetermined levels of machining resolution and precision and machining rates for a predetermined application,
  the micro- and nano-devices and structures including: Micro-Electro-Mechanical Systems (MEMS); Nano-Electro-Mechanical Systems (NEMS); Microsystems; Nanosystems; Photonics; 3-D integration; heterogeneous integration; and Nanotechnology devices and structures,
  the micro- and nano-devices and structures having a range of depth, lateral or depth and lateral dimensions ranging from less than 10 nanometers to a plurality of millimeters.

47. The system of claim 46, wherein the at least one laser is a femto-second laser, or a conventional laser for performing the machining on the substrate.

48. The system of claim 46, wherein the at least one ion beam is a focused-ion beam laser or a plasma focused-ion beam for performing the machining on the substrate.

49. A method of fabricating of micro- and nano-devices and structures, the method comprising the steps of:
  providing a platform stage on which a substrate is positioned and moved during machining,
  providing a femto-second laser machining capability for performing machining on the substrate,
  providing a focused-ion beam machining capability for performing machining on the substrate,
  providing a plasma focused-ion beam machining capability for performing machining on the substrate, and
  providing a conventional laser machining capability for performing machining on the substrate
  the micro- and nano-devices and structures including: Micro-Electro-Mechanical Systems (MEMS); Nano-Electro-Mechanical Systems (NEMS); Microsytems; Nanosystems; Photonics; 3-D a intergration; heterogeneous integration; and Nanotechnology devices and structures
  the micro- and nano-devices and structures having a range of depth, lateral or depth and lateral dimensions ranging from nanometers to millimeters.

50. The method of claim 49 further comprising the step of providing a close-loop control system.

51. The method of claim 50 further comprising the step of providing a computerized control system connected to the closed-loop control system.

52. The method of claim 51 further comprising the step of the computerized control system through the closed-loop control system controlling and operating in combination (i) the femto-second laser capability, (ii) the plasma focused-ion beam capability, (iii) the conventional laser capability, and/or (iv) the focused-ion beam capability, to achieve a predetermined dynamic range of removal rates and resolution selected for a predetermined application.

53. The method of claim 52, wherein the computerized control system through the closed-loop control system controlling and operating in combination (i) the femto-second laser capability, (ii) the plasma focused-ion beam capability, (iii) the conventional laser capability, and/or (iv) the focused-ion beam capability achieves the machining of a range of features sizes from about 10 nm up to above 10 microns, which is a dynamic range of feature sizes of more than 1,000, and a range of machining rates from below $10^{-2}$ micron$^3$/sec to more than $10^6$ microns$^3$/sec, which a dynamic range of machining rates of more than $10^8$.

54. A method of fabricating micro- and nano-devices and structures, the method comprising the steps of providing a platform stage on which a substrate is positioned and moved during machining, providing a close-loop control system and providing at least one laser which is controlled and operated by the close-loop control system so as to be capable of achieving predetermined levels of machining resolution and precision and machining rates for a predetermined application,
  the micro- and nano-devices and structures including: Micro-Electro-Mechanical Systems (MEMS); Nano-Electro-Mechanical Systems (NEMS); Microsytems: Nanosystems; Photonics; 3-D integration; heterogeneous integration; and Nanotechnology devices and structures,
  the micro- and nano-devices and structures having a range of depth, lateral or depth and lateral dimensions ranging from less than 10 nanometers to a plurality of millimeters.

55. A method of fabricating micro- and nano-devices and structures, the method comprising the steps of providing a platform stage on which a substrate is positioned and moved during machining, providing a close-loop control system and providing at least one ion beam which is controlled and operated by the close-loop control system so as to be capable of achieving predetermined levels of machining resolution and precision and machining rates for a predetermined application,
  the micro- and nano-devices and structures including: Micro-Electro-Mechanical Systems (MEMS); Nano-Electro-Mechanical Systems (NEMS); Microsytems; Nanosystems; Photonics; 3-D integration: heterogeneous integration; and Nanotechnology devices and structures,
  the micro- and nano-devices and structures having a range of depth, lateral or depth and lateral dimensions ranging from less than 10 nanometers to a plurality of millimeters.

56. A method of fabricating micro- and nano-devices and structures, the method comprising the steps of providing a platform stage on which a substrate is positioned and moved during machining and providing a plurality of lasers and/or focused-ion beams capable of achieving predetermined levels of machining resolution and precision and machining rates for a predetermined application,
  the micro- and nano-devices and structures including: Micro-Electro-Mechanical Systems (MEMS): Nano-Electro-Mechanical Systems (NEMS); Microsytems; Nanosystems; Photonics; 3-D integration; heterogeneous integration; and Nanotechnology devices and structures, the micro- and nano-devices and structures having a range of depth, lateral or depth and lateral dimensions ranging from less than 10 nanometers to a plurality of millimeters.

57. The method of claim 56, wherein the a plurality of machining capabilities are selected from a femto-second laser, a focused-ion beam, a plasma focused-ion beam, and a conventional laser for performing machining on the substrate, the selection of lasers and ion beams being determined by the predetermined levels of machining resolution and precision and machining rates to be achieved for a predetermined application.

58. The system of claim 1, wherein the micro- and nano-devices and structures have a range of depth, lateral or depth and lateral dimensions ranging from less than 10 nm to a plurality of millimeters.

59. The method of claim 49, wherein the micro- and nano-devices and structures have a range of depth, lateral or depth and lateral dimensions ranging from less than 10 nm to a plurality of millimeters.

* * * * *